United States Patent
Takata et al.

(10) Patent No.: US 6,500,675 B2
(45) Date of Patent: Dec. 31, 2002

(54) MANUFACTURING METHOD OF SEMICONDUCTOR DEVICE HAVING CAPACITIVE ELEMENT

(75) Inventors: Yoshifumi Takata, Hyogo (JP); Junko Izumitani, Hyogo (JP); Shigeki Sunada, Hyogo (JP)

(73) Assignees: Mitsubishi Denki Kabushiki Kaisha, Tokyo (JP); Ryoden Semiconductor System Engineering Corporation, Hyogo (JP)

( * ) Notice: Subject to any disclaimer, the term of this patent is extended or adjusted under 35 U.S.C. 154(b) by 5 days.

(21) Appl. No.: 09/837,461

(22) Filed: Apr. 19, 2001

(65) Prior Publication Data

US 2002/0074587 A1 Jun. 20, 2002

(30) Foreign Application Priority Data

Dec. 15, 2000 (JP) .................................... 2000-382038

(51) Int. Cl.[7] .......................................... H01L 21/8242
(52) U.S. Cl. .......................................... 438/3; 438/253
(58) Field of Search ............................ 438/3, 240, 238, 438/253–256, 381, 396–399

(56) References Cited

U.S. PATENT DOCUMENTS 6,051,858 A * 4/2000 Uchida et al. ............... 257/295
6,284,588 B1 * 9/2001 Yu ................................ 438/240
6,337,238 B1 * 1/2002 Nakabayashi ............... 438/240

FOREIGN PATENT DOCUMENTS

JP          11-274428          10/1999

* cited by examiner

Primary Examiner—Jey Tsai
(74) Attorney, Agent, or Firm—McDermott, Will & Emery

(57) ABSTRACT

A dielectric layer for capacitive element is formed on a lower electrode. An interlayer insulating layer is formed on the lower electrode and the dielectric layer for capacitive element. A plug hole reaching the dielectric layer for capacitive element is formed in the interlayer insulating layer. Upper electrodes are formed to fill in the plug hole and positioned opposite to the lower electrode with the dielectric layer for capacitive element interposed. The dielectric layer for capacitive element is in contact with the upper surface of the lower electrode at a region directly below the plug hole and a region outside the sidewall of the plug hole. Thus, a semiconductor device having a capacitive element with a greater capacitance which prevents diffusion of metal atoms from the lower electrode as well as a manufacturing method thereof are provided.

5 Claims, 20 Drawing Sheets

MANUFACTURING METHOD OF SEMICONDUCTOR DEVICE HAVING CAPACITIVE ELEMENT

BACKGROUND OF THE INVENTION

1. Field of the Invention

The present invention relates to semiconductor devices having capacitive elements and manufacturing methods thereof. More particularly, the present invention relates to a semiconductor device having a plurality of metal interconnection layers on a semiconductor substrate and having a capacitive element in an opening of an insulating layer between upper and lower metal interconnection layers as well as a manufacturing method thereof.

2. Description of the Background Art

FIG. 16 is a cross sectional view schematically showing a structure of a conventional semiconductor device having a capacitive element. A capacitive element C has a lower electrode 109, a dielectric layer for capacitive element 110, and an upper electrode 112. Lower electrode 109 is formed on a surface of a semiconductor substrate 101, which is isolated by a trench isolation 102 and formed when a gate electrode 105 of a transistor T is formed. Lower electrode 109 has a stack of a polysilicon layer 109a doped with impurities and a high melting point metal film 109b of, for example, W (tungsten), Ti (titanium), Co (cobalt), Ni (nickel) or Mo (molybdenum), or a silicide 109b thereof. Upper electrode 112 is formed on lower electrode 109 with dielectric layer for capacitive element 110 interposed. Upper electrode 112 is a polysilicon or amorphous silicon doped with impurities such as P (phosphorus) or As (arsenic), or a compound of a high melting point metal film such as TiN (titanium nitride). Dielectric layer for capacitive element 110 is, for example, a high dielectric film such as a silicon oxide film, silicon nitride film or tantalum oxide film formed by CVD (Chemical Vapor Deposition).

An interlayer insulating layer 107 is formed to cover capacitive element C. Each of lower electrode 109 and upper electrode 112 is electrically connected to a metal interconnection 113 through a metal plug 108 filling in a contact hole 107a. Metal interconnection 113 applies a potential to each of lower electrode 109 and upper electrode 112, so that electric charges are accumulated between the electrodes.

Note that transistor T has a pair of source/drain regions 103, a gate insulating layer 104, and a gate electrode layer 105. The pair of source/drain regions 103 are separated on the surface of semiconductor substrate 101. Gate electrode layer 105 is formed on the region between the pair of source/drain regions 103 through gate insulating layer 104. An insulating layer 106 is formed on gate electrode layer 105. Each of the pair of source/drain regions 103 is electrically connected to metal interconnection 113 through metal plug 108 in contact hole 107a.

In the semiconductor device having a conventional capacitive element, the surface of interlayer insulating layer 107 covering capacitive element C and transistor T is planarized by CMP (Chemical Mechanical Polishing). The planarization is performed to reduce steps at the surface of interlayer insulating layer 107, so as to facilitate pattern formation at the upper layer by photolithography for greater dimensional accuracy.

When the planarization is performed by CMP, however, the upper surface of interlayer insulating layer 107 is planarized almost completely, whereby a thickness h1 of films on gate electrode 105 becomes smaller than a thickness h3 of a film on source/drain region 103 by a thickness of gate electrode 105. Likewise, a thickness h2 of a film on upper electrode 112 becomes smaller than thickness h1 of films on gate electrode 105 by the thicknesses of dielectric layer for capacitive element 110 and upper electrode 112.

Usually, there is a variation in thickness of films removed at the time of planarization by CMP. Thus, thickness h2 must be sufficiently large to prevent exposure of upper electrode 112 from interlayer insulating layer 107 during planarization. However, as thickness h2 increases, thickness h3 of the film on source/drain region 107 inevitably increases. The increase in thickness h3 results in greater aspect ratio of contact hole 107a (a ratio of depth to diameter of contact hole 107a) reaching source/drain region 103. As a result, it becomes difficult to stably form, by dry etching, contact hole 107a with sufficient dimensional accuracy. In some cases, the etching stops en route, preventing proper formation of contact hole 107a.

A technique for solving the aforementioned problem is disclosed in Japanese Patent Laying-Open No. 11-274428. FIG. 17 is a cross-sectional view schematically showing a structure of a semiconductor device having a capacitive element disclosed in the aforementioned laid-open application No. 11-274428. Referring to FIG. 17, capacitive element C has a lower electrode 209, a dielectric layer for capacitive element 210, and an upper electrode 212A. Lower electrode 209 is formed on a silicon oxide film 207 [209] on a silicon substrate 201, having a polysilicon film 209a and a titanium silicide film 209b. Upper electrode 212A is formed to fill in a hole 211a opened in an interlayer insulating layer 211. Upper electrode 212A is electrically connected to an aluminum interconnection 213A deposited on interlayer insulating layer 211.

Now, a method of manufacturing the semiconductor device having the capacitive element will be described.

FIGS. 18 to 23 are schematic cross sectional views sequentially showing the method of manufacturing the semiconductor device having the capacitive element shown in FIG. 17. Referring to FIG. 18, after silicon oxide film 207 is formed on silicon substrate 201, a lower electrode 209 having polysilicon film 209a and titanium silicide film 209b is formed.

Referring to FIG. 19, interlayer insulating layer 211 is formed to cover lower electrode 209. An opening 211a reaching lower electrode 209a is opened in interlayer insulating layer 211. A silicon nitride film 210, later to be a dielectric layer for capacitive element, is formed over the entire surface to cover the inner surface of opening 211a.

Referring to FIG. 20, a contact hole 211b reaching lower electrode 209 is formed in interlayer insulating layer 211 and silicon nitride film 210.

Referring to FIG. 21, a tungsten film 212 is formed over the entire surface to fill in hole 211a and contact hole 211b. Thereafter, tungsten film 212 is polished by CMP.

Referring to FIG. 22, the upper surface of silicon nitride film 210 is exposed by CMP, so that upper electrode 211A and a plug conductive layer 212B of tungsten are formed.

Referring to FIG. 23, any unwanted portion of silicon nitride film 210, exposed from the surface, is removed by dry etching.

Thereafter, the aluminum interconnection layer is formed to complete a semiconductor device having capacitive element C as shown in FIG. 17.

In the structure shown in FIG. 17, upper electrode 212A for capacitive element C is formed as a plug layer filling in hole 211A. Thus, upper electrode 212A can be electrically connected to aluminum interconnection layer 213B directly at the upper surface of interlayer insulating layer 211. This eliminates the need for a contact hole connecting upper electrode 212A and aluminum interconnection 213B, so that the thickness of interlayer insulating layer 211 is restrained. Thus, the problem as described in conjunction with the structure of FIG. 16, associated with greater thickness h3 of the film on source/drain region 103, can be alleviated.

However, the structure shown in FIG. 17 still suffers from problems associated with a complicated manufacturing process or insufficient capacity of the capacitive element when diffusion of metal atoms from a lower electrode is considered. In the following, the problems will be described in detail.

(1) Increased number of manufacturing steps

In the structure shown in FIG. 17, for example, if copper (Cu) is used for lower electrode 209, the copper atoms easily diffuse into an insulating layer such as a silicon oxide film, causing a change of threshold voltage of the transistor or the like. Thus, lower electrode 209 is covered with a barrier layer to prevent diffusion of the copper atoms from lower electrode 209.

In the structure of FIG. 17, additional barrier layer is required for that purpose, involving additional manufacturing steps.

Alternatively, dielectric layer for capacitive element 210 can be provided with a function of preventing diffusion of copper atoms. However, in the structure of FIG. 17, dielectric layer for capacitive element 210 is formed only in hole 211a, so that the diffusion of copper atoms from lower electrode 209 cannot be reliably prevented.

(2) Capacitance of capacitive element C

In the structure of FIG. 17, lower electrode 209 and upper electrode 212A, that are opposite to each other, are flat in shape. Therefore, the capacitive element cannot ensure a sufficient capacitance.

SUMMARY OF THE INVENTION

An object of the present invention is to provide a semiconductor device having a capacitive element capable of preventing diffusion of metal atoms from a lower electrode with a streamlined manufacturing process as well as a manufacturing method thereof.

Another object of the present invention is to provide a semiconductor device having a capacitive element allowing proper formation of a contact hole and providing increased capacitance as well as a manufacturing method thereof.

A semiconductor device having a capacitive element according to one aspect of the present invention is provided with a lower electrode layer, a dielectric layer for capacitive element, an insulating layer, and an upper electrode layer. The dielectric layer for capacitive element is formed on the lower electrode layer. The insulating layer is formed on the lower electrode layer and the dielectric layer for capacitive element and has a hole reaching the dielectric layer for capacitive element. The upper electrode layer fills in the hole and is disposed opposite to the lower electrode layer with the dielectric layer for capacitive element interposed. The dielectric layer for capacitive element is in contact with an upper surface of the lower electrode layer at a region outside the region directly below the hole and the sidewall of the hole.

In the semiconductor device having the capacitive element according to one aspect of the present invention, the dielectric layer for capacitive element is in contact with the lower electrode layer not only at the region directly below the hole but also at the region outside the sidewall of the hole, so that the semiconductor device produces greater effect of preventing diffusion of metal atoms from the lower electrode layer as compared with the conventional structure (FIG. 17).

Additional diffusion barrier layer is not necessary since the dielectric layer for capacitive element also acts as such a diffusion barrier layer. Thus, additional step of forming the diffusion barrier layer is unnecessary, whereby a diffusion barrier layer with sufficient diffusion preventing effect can be provided by a streamlined manufacturing process.

The upper electrode layer is formed as a plug layer to fill in the hole opened in the insulating layer. Accordingly, the upper electrode layer is electrically connected to a portion which is later to be an interconnection, directly at the upper surface of the insulating layer. Thus, a contact hole needs not be opened to connect the upper electrode layer and interconnection portion, whereby the thickness of the insulating layer can be restrained. As a result, the problem associated with increased thickness of the insulating layer on the source/drain region of the conventional example can be alleviated.

In the semiconductor device having the capacitive element according to one aspect of the present invention, preferably, the dielectric layer for capacitive element is in contact with the side surface of the lower electrode layer.

This prevents diffusion of metal atoms from the lower electrode layer.

In the semiconductor device having the capacitive element according to one aspect of the present invention, preferably, the dielectric layer for capacitive element has a sidewall constituting a surface that is substantially continuous to the sidewall of lower electrode layer.

This enables patterning of the lower electrode layer and the dielectric layer for capacitive element with use of the same mask. Thus, as compared with the case where different masks are used for patterning the dielectric layer for capacitive element and the lower electrode layer, less masks are used.

A semiconductor device having a capacitive element according to another aspect of the present invention is provided with a first lower electrode portion, an insulating layer, a second lower electrode portion, a dielectric layer for capacitive element, and an upper electrode layer. The insulating layer is formed on the first lower electrode portion and has a hole reaching the first lower electrode portion. The second lower electrode portion has a cylindrical portion formed along the side surface of the hole and is electrically connected to the first lower electrode portion. The dielectric layer for capacitive element is formed on the second lower electrode portion. The upper electrode portion fills in the hole and is opposite to the second lower electrode portion through the dielectric layer for capacitive element.

In the semiconductor device having the capacitive element according to another aspect of the present invention, the second lower electrode portion is formed along the side surface of the hole, having a cylindrical portion. This contributes to an increase in area where the lower and upper electrode portions are opposite to each other, whereby the capacitive element may have increased capacitance.

The upper electrode layer is formed as a plug layer which fills in the hole opened in the insulating layer. Thus, the upper electrode layer can be electrically connected to a portion to be an interconnection directly at the upper surface of the insulating layer. Thus, a contact hole for connecting the upper electrode layer and the interconnection portion needs not to be provided, whereby the thickness of the insulating layer can be restrained. Consequently, the problem associated with increased thickness of the insulating layer on the source/drain region of the conventional example can be alleviated.

In the semiconductor device having the capacitive element according to another aspect, preferably, the second lower electrode portion is not positioned on the upper surface of the insulating layer.

Thus, the second lower electrode portion can be patterned as separate from the dielectric layer for capacitive element or the like.

In the semiconductor device having the capacitive element according to another aspect, preferably, the second lower electrode portion has a portion extending on the upper surface of the insulating layer.

This enables the second lower electrode portion and the dielectric layer for capacitive element and the like to be patterned by the same mask.

In the semiconductor device having the capacitive element according to another aspect, preferably, the hole is formed to have a diameter greater than the area of the first lower electrode portion when viewed from above.

The hole filled with the upper electrode layer has a greater diameter, so that the capacitance of the capacitive element can be increased.

In the semiconductor device having the capacitive element according to another aspect, preferably, a plurality of holes are formed, each reaching the first lower electrode portion. The second lower electrode portion has a portion extending along a circumferential surface of each of the plurality of holes, and the upper electrode layer is formed to fill in each of the plurality of holes.

The capacitive element can be provided with increased capacitance by convex and concave portions formed by the plurality of holes.

A method of manufacturing a semiconductor device having a capacitive element according to one aspect of the present invention is provided with steps of: forming a dielectric layer for capacitive element on a lower electrode layer; forming an insulating layer to cover the lower electrode layer and the dielectric layer for capacitive element; forming a hole in the insulating layer reaching the dielectric layer for capacitive element; and forming an upper electrode layer to fill in the hole.

In the method of manufacturing the semiconductor device having the capacitive element according to one aspect of the present invention, a hole is formed after the lower electrode layer is covered with the dielectric layer for capacitive element. Thus, the dielectric layer for capacitive element is in contact with the lower electrode not only at a region directly below the hole but also at a region outside the hole. Thus, as compared with the conventional structure (FIG. 17), the semiconductor device is provided with enhanced effect of preventing diffusion of metal atoms from the lower electrode.

The dielectric layer for capacitive element also acts as a diffusion barrier layer, so that no additional diffusion barrier layer is necessary. Thus, additional step of forming the diffusion barrier layer is unnecessary, whereby a diffusion barrier layer with enhanced diffusion preventing effect can be obtained by a streamlined manufacturing process.

The upper electrode layer is formed as a plug layer which fills in the hole opened in the insulating layer. Thus, the upper electrode layer can be electrically connected to a portion, later to be an interconnection, directly at the upper surface of the insulating layer. As a result, a contact hole for connecting the upper electrode layer and the interconnection portion needs not be formed, whereby the thickness of the insulating layer can be restrained. Consequently, the problem of the conventional example associated with increased thickness of the insulating layer on the source/drain region can be alleviated.

In the method of manufacturing the semiconductor device having a capacitive element according to one aspect, preferably, the step of forming the dielectric layer for capacitive element on the lower electrode layer has a step of forming the dielectric layer for capacitive element to cover the upper and side surfaces of the lower electrode layer after patterning the lower electrode layer.

Thus, diffusion of metal atoms from the side surface of the lower electrode layer can be prevented.

In the method of manufacturing the semiconductor device having the capacitive element according to one aspect, preferably, the step of forming the dielectric layer for capacitive element on the lower electrode layer has a step of patterning a conductive layer and the dielectric layer for capacitive element after forming the dielectric layer for capacitive element on the conductive layer later to be a lower electrode layer.

This enables patterning of the lower electrode layer and the dielectric layer for capacitive element with use of the same mask. Thus, as compared with case where the dielectric layer for capacitive element and the lower electrode layer are patterned with use of different masks, the process can be simplified.

A method of manufacturing a semiconductor device having a capacitive element according to another aspect of the present invention is provided with steps of: forming a first lower electrode portion; forming an insulating layer on the first lower electrode portion; forming a hole reaching the first lower electrode portion in the insulating layer; forming a second lower electrode portion having a portion along the side wall of the hole and electrically connected to the first lower electrode portion; forming a dielectric layer for capacitive element on the second lower electrode portion; and forming an upper electrode layer which fills in the hole and is opposite to the second lower electrode portion with the dielectric layer for capacitive element interposed.

In the method of manufacturing the semiconductor device having the capacitive element according to another aspect of the present invention, the second lower electrode portion is formed along the sidewall of the hole, hence having a cylindrical portion. This increases an area where the lower and upper electrodes are opposite to each other, so that the capacitive element may have increased capacitance.

The upper electrode layer is formed as a plug layer which fills in the hole opened in the insulating layer. Thus, the upper electrode layer can be electrically connected to a portion, later to be an interconnection, directly at the upper surface of the insulating layer. As a result, a contact hole for connecting the upper electrode layer and the interconnection portion needs not be formed, whereby the thickness of the insulating layer can be restrained. Consequently, the problem of the conventional example associated with increased thickness of the insulating layer on the source/drain region can be alleviated.

In the method of manufacturing the semiconductor device having the capacitive element according to another aspect, preferably, the step of forming the second lower electrode portion has a step of forming a conductive layer, which is later to be a second lower electrode portion, to cover the inner surface of the hole and the upper surface of the insulating layer and then patterning the conductive layer to leave it only in the hole.

This enables the second lower electrode portion to be patterned as separate from the dielectric layer for capacitive element or the like.

In the method of manufacturing the semiconductor device having the capacitive element according to another aspect, preferably, the step of forming the second lower electrode portion has a step of forming a conductive layer, which is later to be a second lower electrode portion, to cover the inner surface of the hole and the upper surface of the insulating layer and then patterning the conductive layer along with the dielectric layer for capacitive element formed on the conductive layer later to be the second lower electrode portion to leave them in the hole and at a part of the upper portion of the insulating layer.

This enables the second lower electrode portion, the dielectric layer for capacitive element and the like to be patterned by the same mask.

In the method of manufacturing the semiconductor device having the capacitive element according to another aspect, preferably, the hole is formed to have a diameter greater than the area of the upper surface of the first lower electrode portion when viewed from above.

The diameter of the hole filled with the upper electrode layer is increased, so that the capacitive element may have increased capacitance.

In the method of manufacturing the semiconductor device having the capacitive element according to another aspect, preferably, a plurality of holes are formed, each of which reaching the first lower electrode portion. The second lower electrode portion has a portion extending along the sidewall of the plurality of holes, and the upper electrode portion is formed to fill in each of the plurality of hole.

The convex and concave portions formed by the plurality of holes may provide a capacitive element with greater capacitance.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Now, the embodiments of the present invention will be described with reference to the drawings.

First Embodiment

Figure 1:
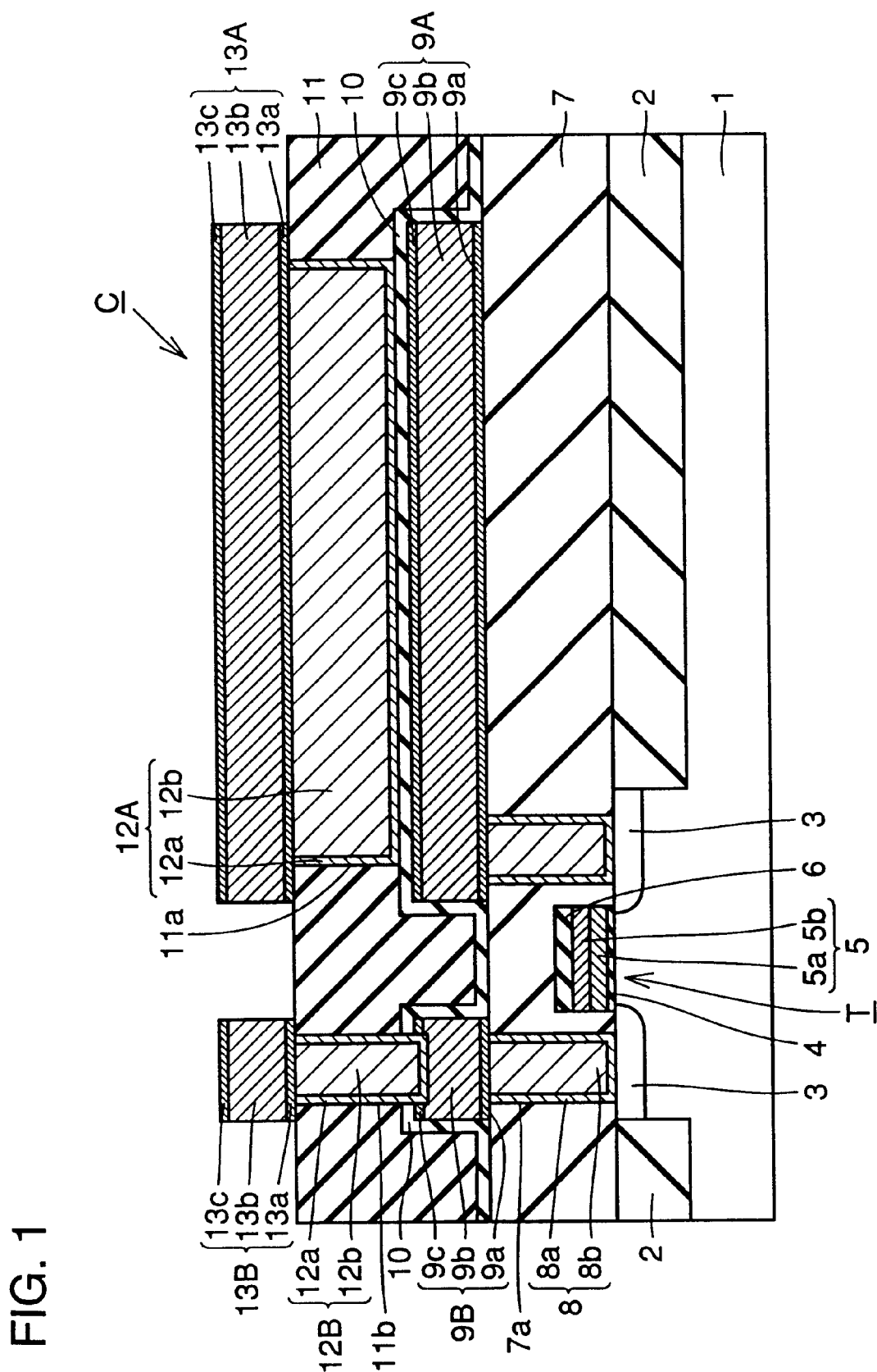
FIG. 1 is a cross sectional view schematically showing a structure of a semiconductor device having a capacitive element according to a first embodiment of the present invention.

Referring to FIG. 1, the surface of a semiconductor substrate 1 formed for example of silicon is electrically isolated by an oxide film for device isolation 2 of a trench isolation. An MIS (Metal Insulator Semiconductor) transistor T is, for example, formed on the electrically isolated surface.

MIS transistor T has a pair of source/drain regions 3, a gate insulating layer 4, and a gate electrode layer 5. The pair of source/drain regions 3 are separated by a given distance. Gate electrode layer 5 is formed on the region between the pair of source/drain regions 3 through gate insulating layer 4. For gate insulating layer 4, a high dielectric layer such as a silicon nitride film, a silicon oxide film, a tantalum oxide film or the like is used. Gate electrode layer 5 has a stack of a polysilicon or amorphous silicon 5a doped with impurities such as phosphorus or arsenic as well as a high melting point metal film compound 5b of, e.g., titanium nitride. An insulating layer 6 is formed on gate electrode layer 5.

An interlayer insulating layer 7 is formed to cover MIS transistor T over the entire surface. Interlayer insulating layer 7 is formed for example of a silicon oxide film and, is subjected to planarization by CMP if it has large steps at its surface. The large step at the surface of interlayer insulating layer 7 results in defocusing (out of focus) during photolithography, causing deterioration of a resist pattern or dimensional variation. The planarization avoids such problems.

A contact hole 7a reaching source/drain regions 3 is formed in interlayer insulating layer 7. Contact hole 7a is filled with a metal plug 8. Metal plug 8 has a first layer 8a to assure adhesion with respect to interlayer insulating layer 7 and to stabilize a resistance value for electrical connection with source/drain regions 3 or gate electrode layer 5 of MIS transistor T, as well as a second layer 8b, a main component of metal plug 8. First layer 8a includes a high melting point metal such as Ti, Ta, W, Mo, and Hf, or nitride or silicide thereof, or any combination of these materials. Second layer 8b is formed for example of W, Ti, TiN, Cu, Al, AlSi, or AlCu.

A capacitive element C and a first metal interconnection layer 9B are formed on interlayer insulating layer 7. Capacitive element C has a lower electrode 9A, a dielectric layer for capacitive element 10, and upper electrodes 12A, 13A.

Lower electrode 9A is electrically connected to one of the pair of source/drain regions 3 through metal plug 8. For lower electrode 9A, metal layer 9b of an Al alloy such as Al, AlSi, AlSiCu, or AlCu, or W, Cu, or TiN is sandwiched between metal layers 9a and 9c of e.g., TiN, TaN, WN, WSi, or MoSi. Metal layers 9a and 9b are formed for the purpose of decreasing a surface reflectance during photolithography to facilitate formation of resist pattern and improving reliability of metal interconnections. First metal interconnection layer 9B has the same stack of 9a, 9b, 9c as lower electrode 9A, and is electrically connected to the other of the pair of source/drain regions 3 through metal plug 8.

Dielectric layer for capacitive element 10 is formed to be in contact not only with the upper surface but also with the side surface of lower electrode 9A. For dielectric layer for capacitive element 10, a silicon oxide film, a silicon nitride film, a metal oxide film such as a tantalum oxide or aluminum oxide, or a metal nitride film is used.

An interlayer insulating layer 11 is formed to cover lower electrode 9A, metal interconnection 9B and the like. Interlayer insulating layer 11 is, for example, a silicon oxide film, a silicon oxide film containing fluorine (F), a silicon carbide (SiC), an organic material containing carbon (C) with a dielectric constant of about 2 to 4, or a stack structure of any of these materials. The upper surface of interlayer insulating layer 11 is planarized by means of, for example, CMP. A plug hole 11a reaching the upper surface of dielectric layer for capacitive element 10 and a through hole 11b reaching metal interconnection layer 9B are formed in interlayer insulating layer 11.

Upper electrodes 12A, 13A respectively consist of a metal plug portion 12A which fills in plug hole 11a and an upper portion 13A which is in contact with the upper surface of metal plug portion 12A. Metal plug portion 12A is opposite to lower electrode 9A through dielectric layer for capacitive element 10, filling in plug hole 11a. Metal plug portion 12A has, like metal plug 8, first layer 12a and second layer 12b. First layer 12a includes a high melting point metal such as Ti, Ta, W, Mo, or Hf, nitride or silicate thereof, or a stack of these materials. Second layer 12b includes W, Ti, TiN, Cu, Al, AlSi, or AlCu.

Like lower electrode 9A, upper electrode 13A includes metal layer 13b of an Al alloy of Al, AlSi, AlSiCu, or AlCu or W, Cu, TiN sandwiched by metal layers 13a and 13c of TiN, TaN, WN, WSi, or MoSi.

Through hole 11b is filled with metal plug 12B. Metal plug 12B has a first layer 12a and a second layer 12b including the same material as that of metal plug portion 12A. A second metal interconnection layer 13B is formed on interlayer insulating layer 11 to have contact with the upper surface of metal plug 12B. Second metal interconnection layer 13B includes metal layers 13a, 13b, and 13c each including the same material as that of upper layer portion 13A.

Now, a method of manufacturing the device of the present embodiment will be described.

Figure 2:
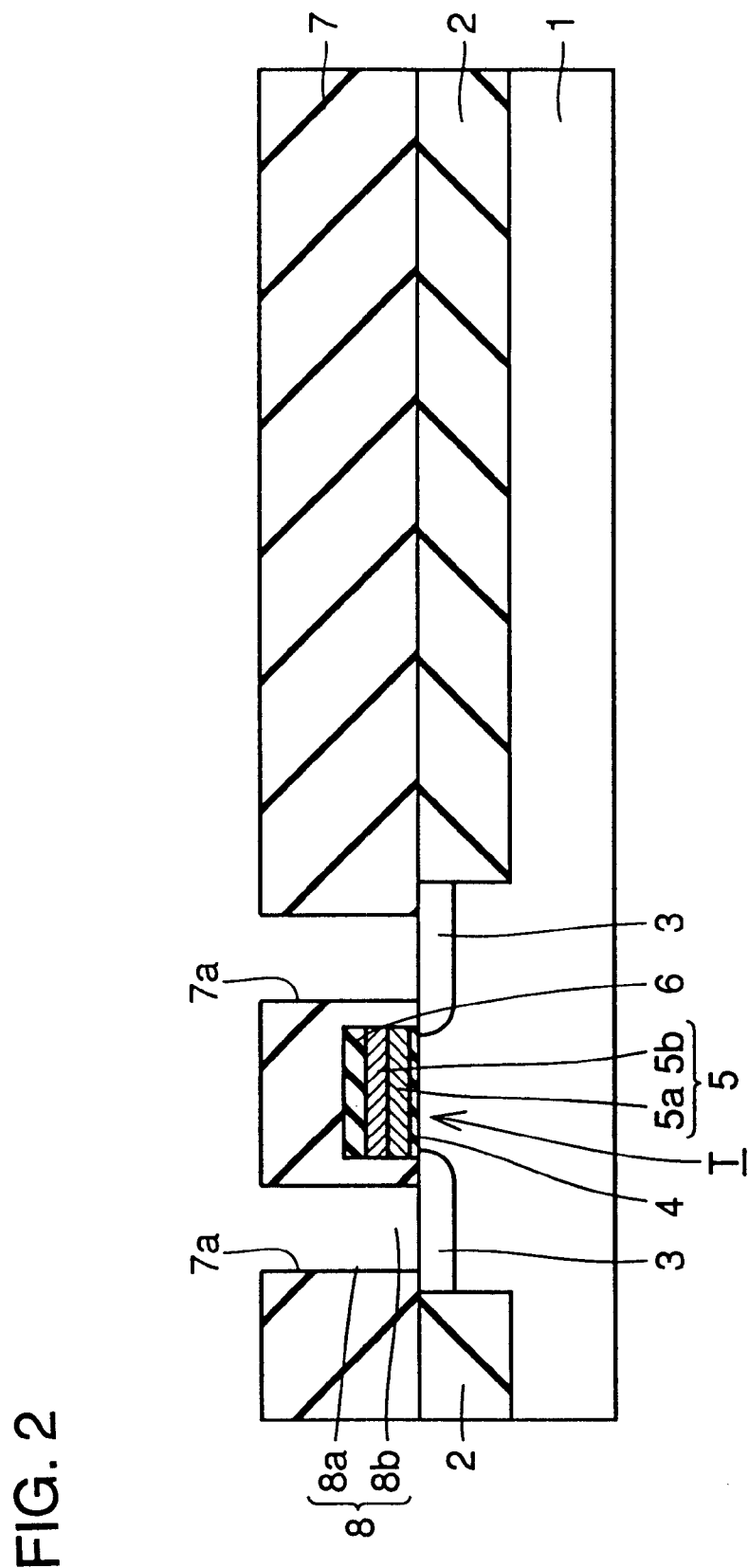
FIGS. 2 to 5 are schematic cross sectional views sequentially showing steps of a method of manufacturing the semiconductor device having the capacitive element according to the first embodiment of the present invention.

Referring to FIG. 2, after an oxide film for element isolation 2 is formed on the surface of a semiconductor substrate 1 of, e.g., silicon, a gate insulating layer 4, a gate electrode layer 5, and an insulating layer 6 are deposited. Thereafter, ion implantation or the like is performed and a pair of source/drain regions 3 are formed. This provides an MIS transistor T.

An interlayer insulating layer 7 is formed to cover the entire surface of MIS transistor T. If interlayer insulating layer 7 has a large step at its surface, defocusing (out of focus) is caused during photolithography, resulting in deterioration of resist pattern or dimensional variation. Thus, planarization is performed by CMP. A contact hole 7a is formed in interlayer insulating layer 7 by usual photolithography and etching.

Figure 3:
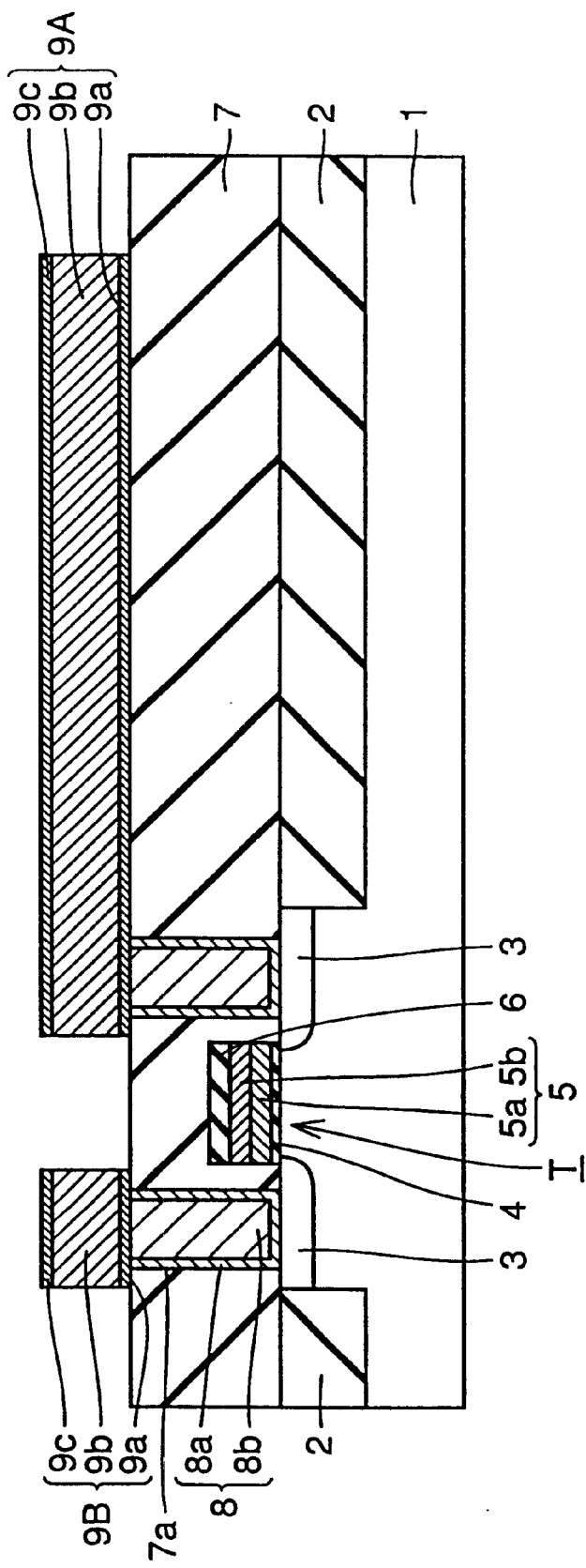

Referring to FIG. 3, a first layer 8a and a second layer 8b are successively formed to fill in contact hole 7a over the entire surface, which are then removed by etch back or CMP. This leaves first and second layers 8a and 8b only in contact hole 7a, providing metal plug 8. Thereafter, metal layers 9a, 9b, and 9c are successively deposited and patterned by usual photolithography and etching. Thus, a lower electrode 9A and a first metal interconnection layer 9B of a stack of metal layers 9a, 9b and 9c are formed at the same time.

Metal layer 9b includes an Al alloy of Al, AlSi, AlSiCu, or AlCu, or W, Cu, or TiN. Metal layers 9a and 9c include TiN, TaN, WN, WSi, or MoSi.

Figure 4:
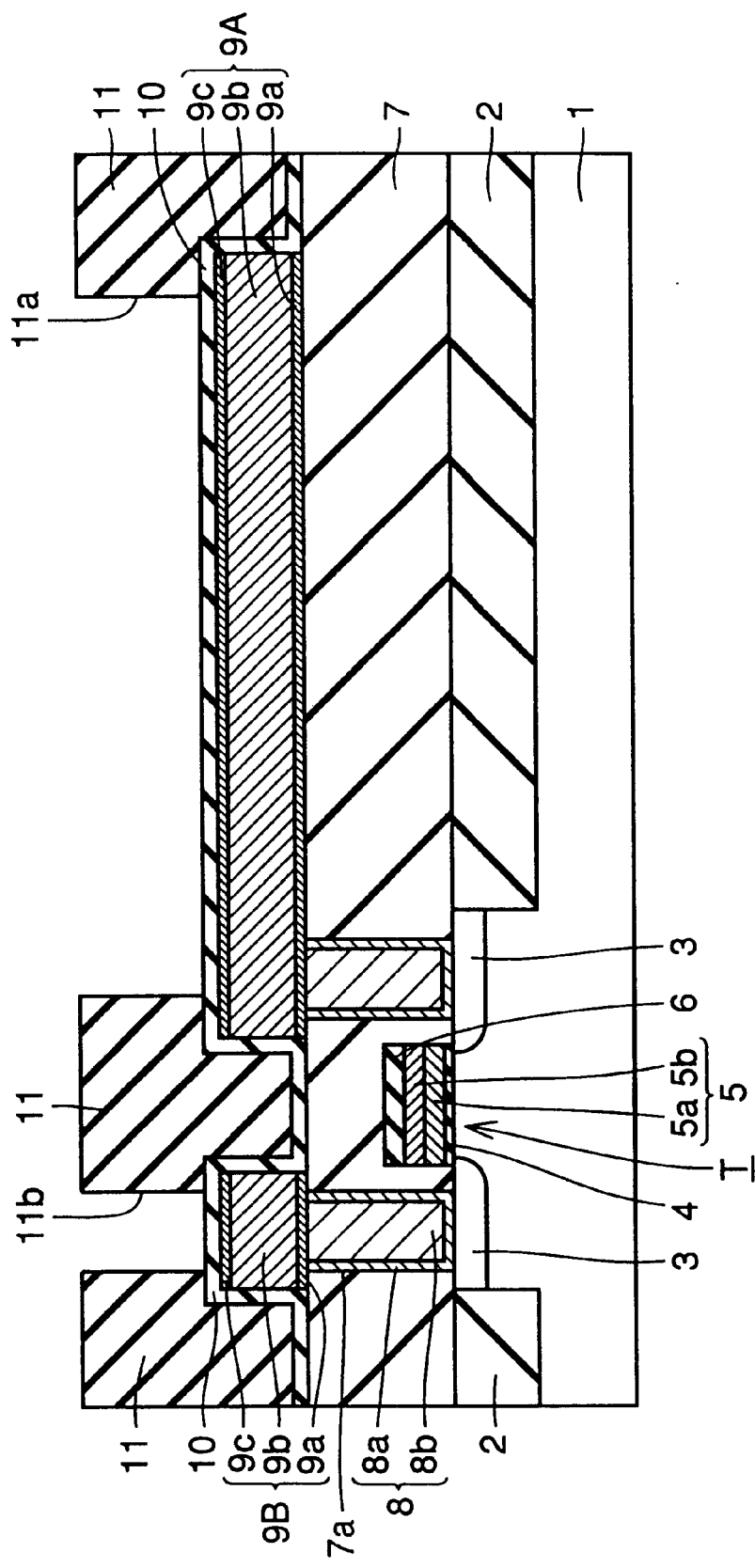

Referring to FIG. 4, a dielectric layer for capacitive element 10 is formed by CVD to cover lower electrode 9A and first metal interconnection layer 9B over the entire surface. For dielectric layer for capacitive element 10, a silicon oxide film, a silicon nitride film, a metal oxide film such as a tantalum oxide or aluminum oxide, or a metal nitride film is used. An interlayer insulating layer 11 is formed to cover dielectric layer for capacitive element 10. Interlayer insulating layer 11 includes a silicon oxide film, a silicon oxide film containing fluorine, a silicon carbide, an organic material containing carbon with a dielectric constant of about 2 to 4, or a stack of these materials.

After interlayer insulating layer 11 is planarized by CMP or the like, ususal photolithography and etching are performed to form plug hole 11a and through hole 11b reaching the surface of dielectric layer for capacitive element 10. In etching, dielectric layer for capacitive element 10 serves as an etching stopper.

Figure 5:
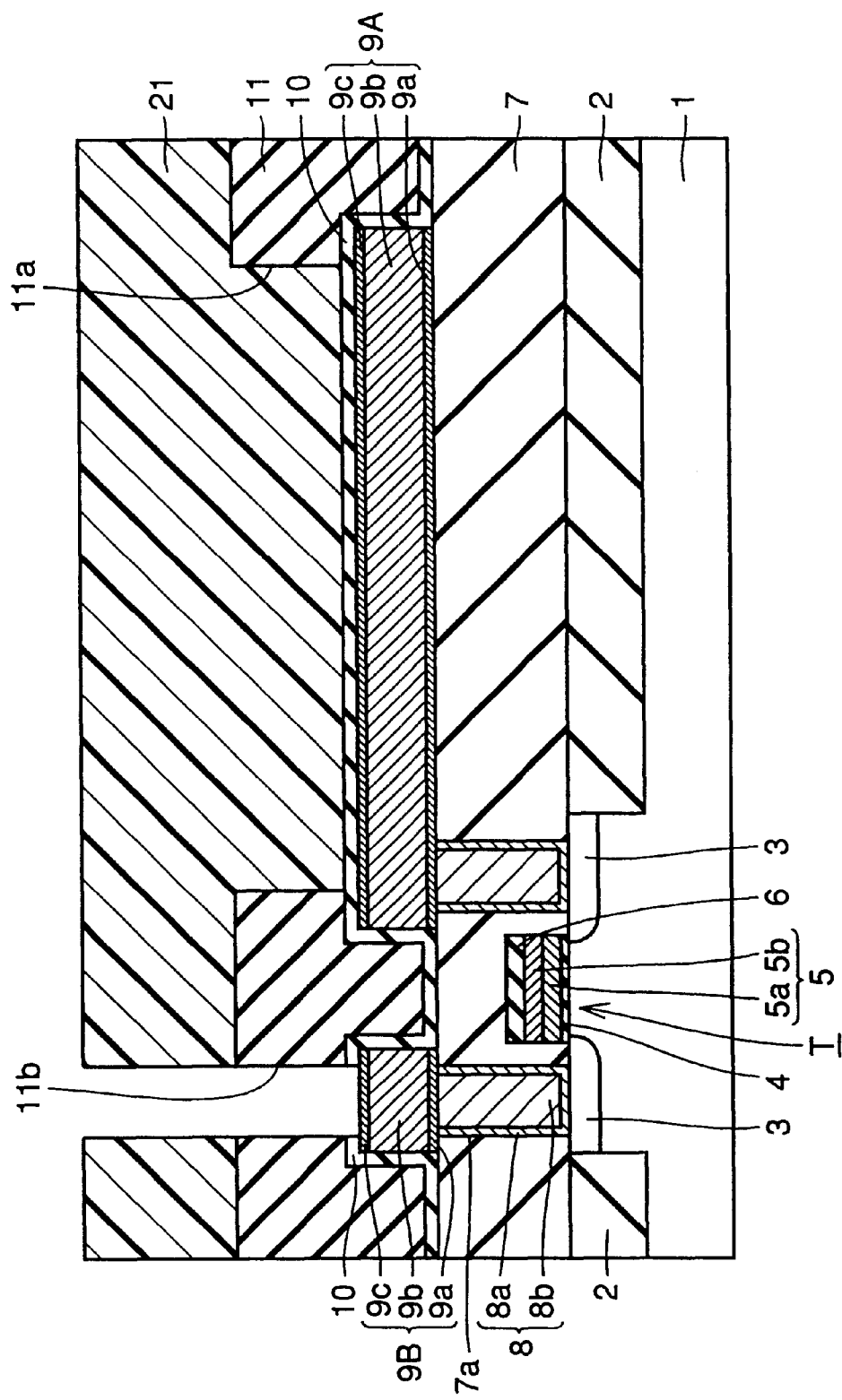

Referring to FIG. 5, a photoresist 21 is applied to the entire surface and then patterned to form an opening directly above through hole 11b by usual photolithography. Resist pattern 21 is used as a mask for etching, so that dielectric layer for capacitive element 10 at the bottom of through hole 11b is removed to expose the upper surface of first metal interconnection layer 9B. Then, resist pattern 21 is removed by ashing or the like.

Subsequently, metal plugs 12A and 12B are formed to fill in plug hole 11a and through hole 11b as shown in FIG. 1. An upper layer portion 13A and a second metal interconnection layer 13B are formed to have contact with metal plugs 12A and 12B, respectively. This completes a semiconductor device having a capacitive element of the present invention.

In the present embodiment, dielectric layer for capacitive element 10 covers not only the upper surface but also the side surface of lower electrode 9A. As such, even if lower electrode 9A has metal elements such as copper which is likely to be diffused into the silicon oxide film, such metal elements are prevented from diffusing into interlayer insulating layer 11. Thus, a variation in threshold voltage of MIS transistor T or the like, which may be caused by diffused metal elements in interlayer insulating layer 11, can be avoided.

In addition, since dielectric layer for capacitive element 10 also acts as a diffusion barrier layer, no separate diffusion barrier layer is necessary. Thus, a step of forming a diffusion barrier layer is not required, whereby a streamlined manufacturing process can provide the device with enhanced diffusion preventing effect.

A portion 12A of upper electrodes 12A and 13A is formed as a plug layer which fills in plug hole 11a. Thus, metal plug portion 12A has a direct contact with upper layer portion 13A, so that a contact hole for connecting them is unnecessary. Thus, interlayer insulating layer 11 has reduced thickness as compared with the case where such a contact hole is formed, whereby the problem associated with improper formation of through hole 11b is eliminated.

The depths of plug hole 11a and through hole 11b differ from each other approximately by a thickness of dielectric layer for capacitive element 10. Thus, even if through hole 11b is formed at the time plug hole 11a is formed, proper formation of through hole 11b can be ensured.

As in the foregoing, diffusion of metal atoms from lower electrode 9A and improper formation of the through hole can be prevented and the electrode of the capacitive element can be used as a metal layer, so that a capacitive element with stabilized electrical characteristic can be provided.

Second Embodiment

Figure 6:
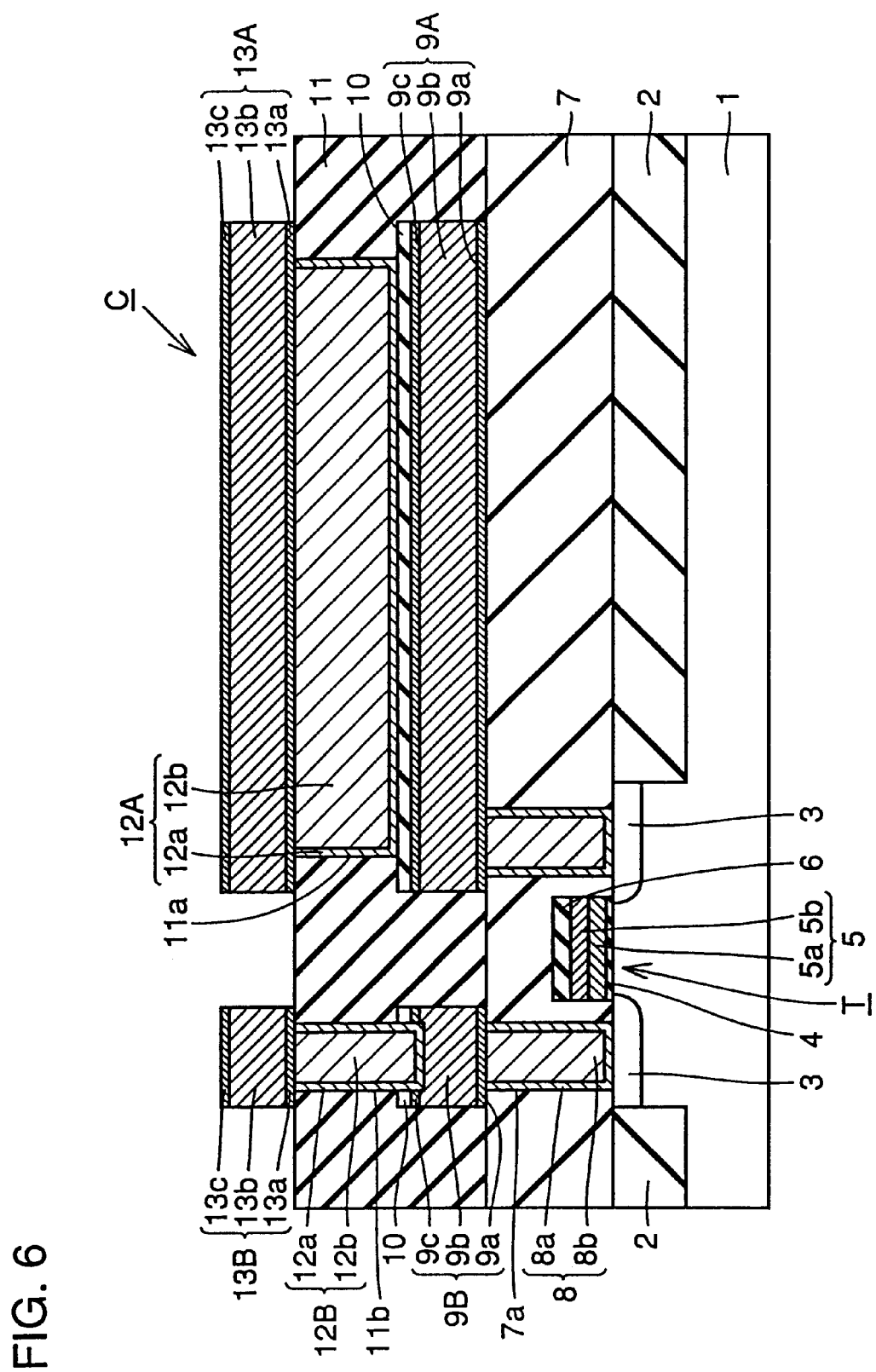
FIG. 6 is a cross sectional view schematically showing a structure of a semiconductor device having a capacitive element according to a second embodiment of the present invention.

Referring to FIG. 6, the structure of the present embodiment differs from that of the first embodiment in the structure of dielectric layer for capacitive element 10. Dielectric layer for capacitive element 10 is formed only on the upper surfaces of lower electrode 9A and first metal interconnection layer 9B, not covering the side surfaces of lower electrode 9A and first metal interconnection layer 9B. The side surface of dielectric layer for capacitive element 10 on lower electrode 9A has a surface continuous to the side surface of lower electrode 9A, whereas the side surface of dielectric layer for capacitive element 10 on first metal interconnection layer 9B has a surface continuous to the side surface of first metal interconnection layer 9B.

Note that the other parts of the structure are almost the same as in the first embodiment, and therefore the same parts are denoted by the same reference characters and the description thereof will not be repeated.

Now, a method of manufacturing the device of the present embodiment will be described.

Figure 7:
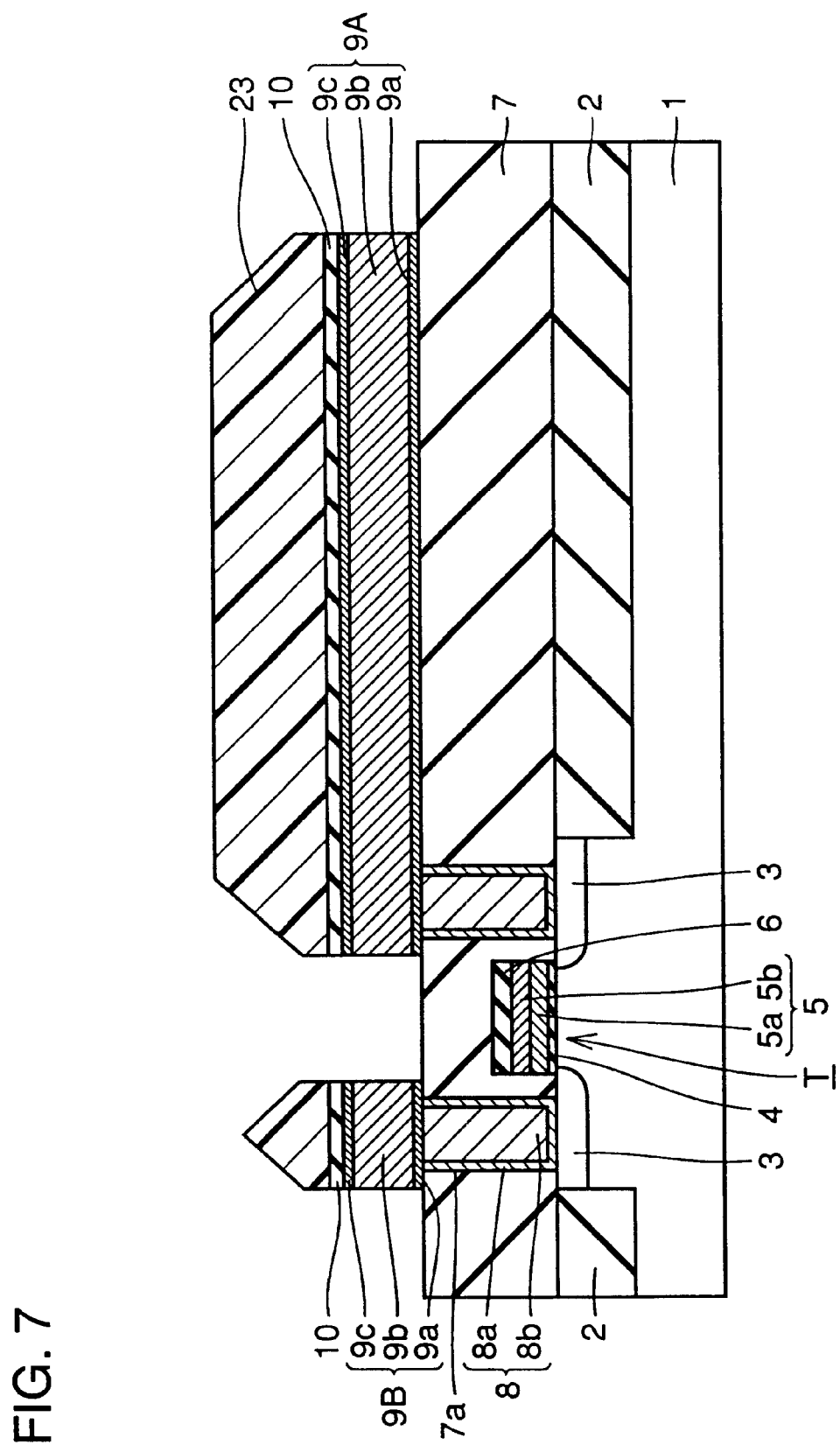
FIG. 7 is a schematic cross sectional view shown in conjunction with a method of manufacturing the semiconductor device having the capacitive element according to the second embodiment of the present invention.

The manufacturing method of the present embodiment is similar to that of the first embodiment up to the steps described with reference to FIG. 2. Thereafter, referring to FIG. 7, a metal plug 8 is formed as in the first embodiment to fill in contact hole 7a. Metal layers 9a, 9b, and 9c are formed on the entire surface of interlayer insulating layer 7. Dielectric layer for capacitive element 10 is formed on the entire surface of the stack of metal layers 9a, 9b, and 9c. A resist pattern 23 is formed on dielectric layer for capacitive element 10 by usual photolithography.

Each of dielectric layer for capacitive element 10 and metal layers 9a, 9b, and 9c are etched and patterned using resist pattern 23 as a mask. This forms a lower electrode 9a and a first metal interconnection layer 9b. Dielectric layer for capacitive element 10 is positioned on the upper surfaces of lower electrode 9A and first metal interconnection layer 9B. The side surface of dielectric layer for capacitive element 10 on lower electrode 9A is continuous to the side surface of lower electrode 9A, whereas the side surface of dielectric layer for capacitive element 10 of first metal interconnection layer 9B is continuous to the side surface of first metal interconnection layer 9B. Like resist pattern 23, dielectric layer for capacitive element 10 acts as an etching mask in etching metal layers 9a, 9b, and 9c. Thereafter, a resist pattern 23 is removed for example by ashing.

By following the steps similar to those of the first embodiment, a semiconductor device having a capacitive element of the present embodiment as shown in FIG. 6 is obtained.

Figure 17:
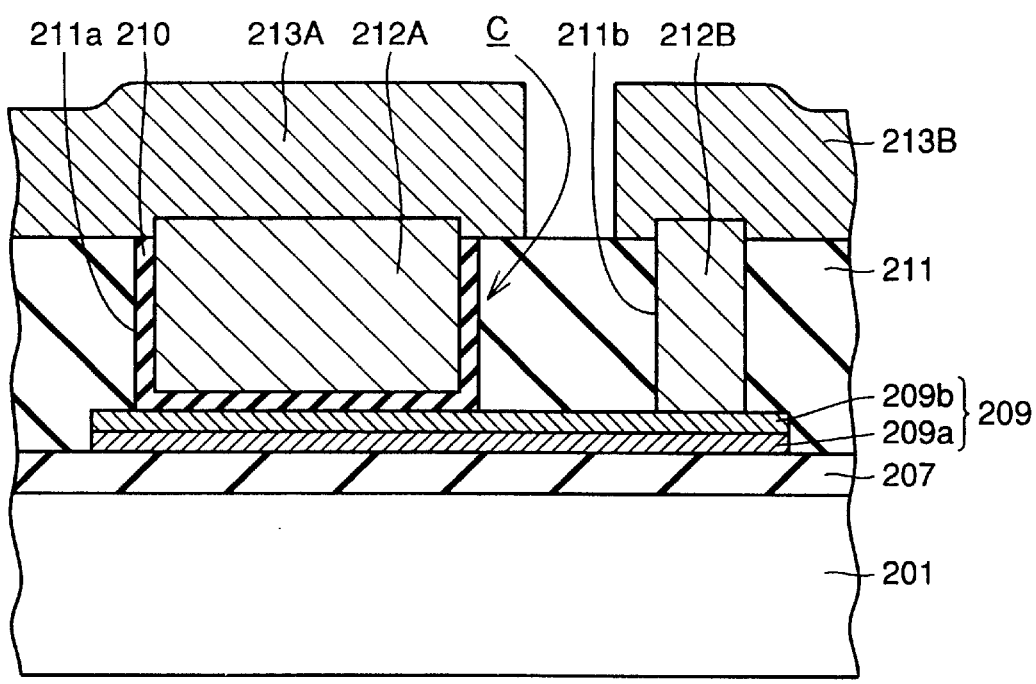
FIG. 17 is a cross sectional view schematically showing a structure of a semiconductor device having a capacitive element disclosed in Japanese Patent Laying-Open No. 11-274428.
Figure 18:
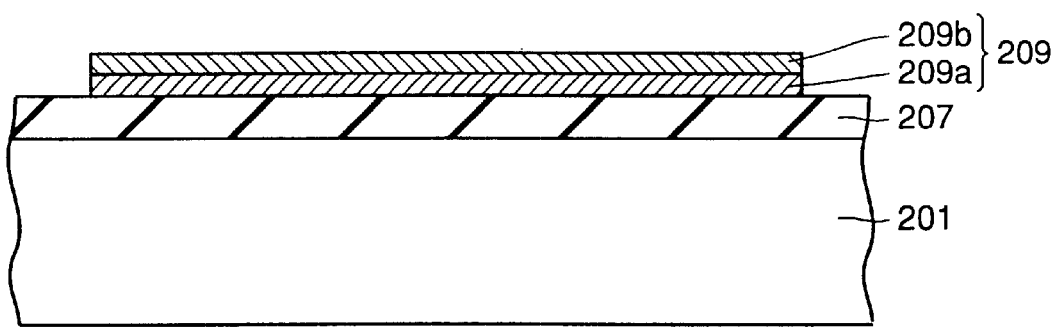
FIGS. 18 to 23 are schematic cross sectional views sequentially showing steps of a method of manufacturing the semiconductor device of FIG. 17.
Figure 19:
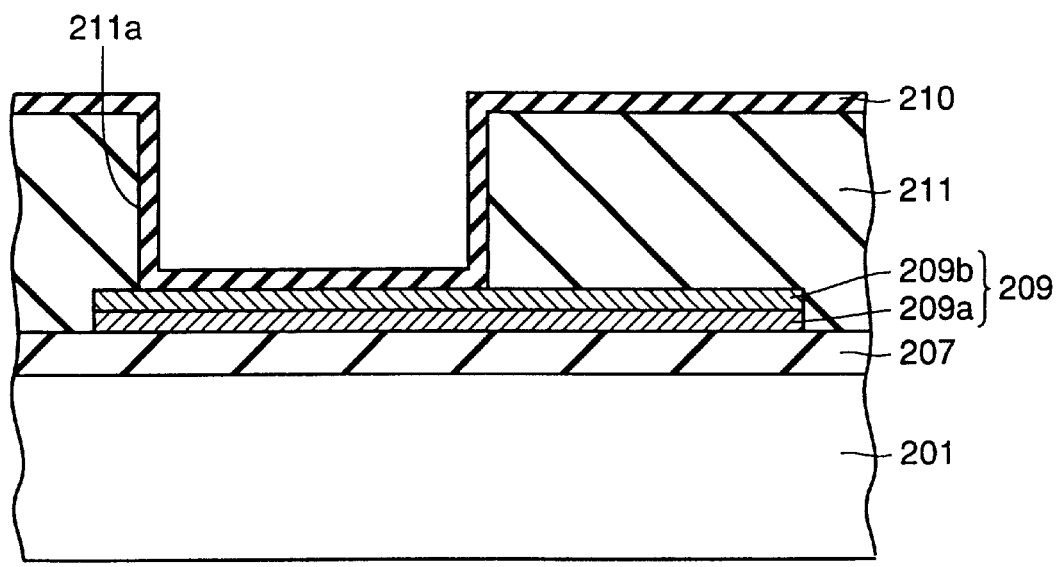
Figure 20:
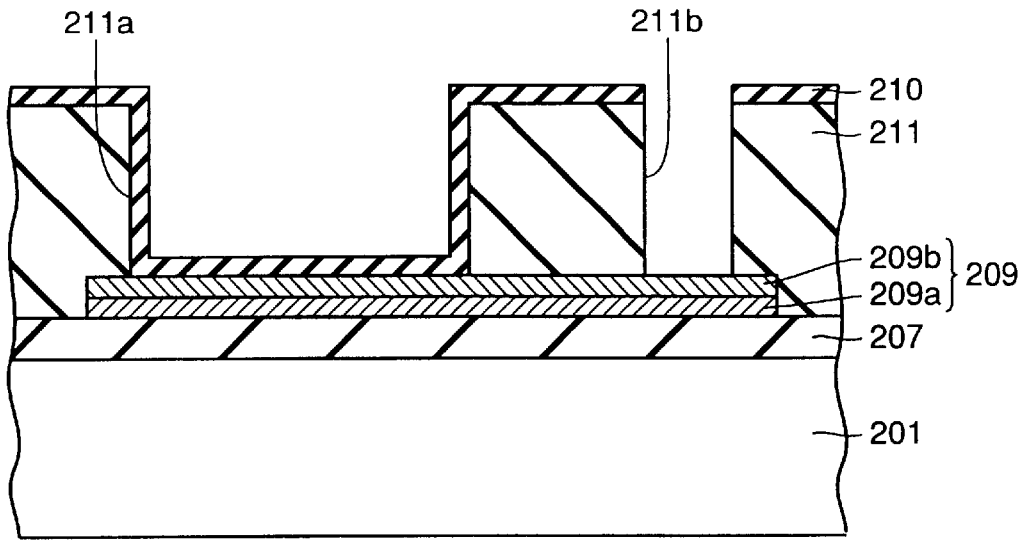
Figure 21:
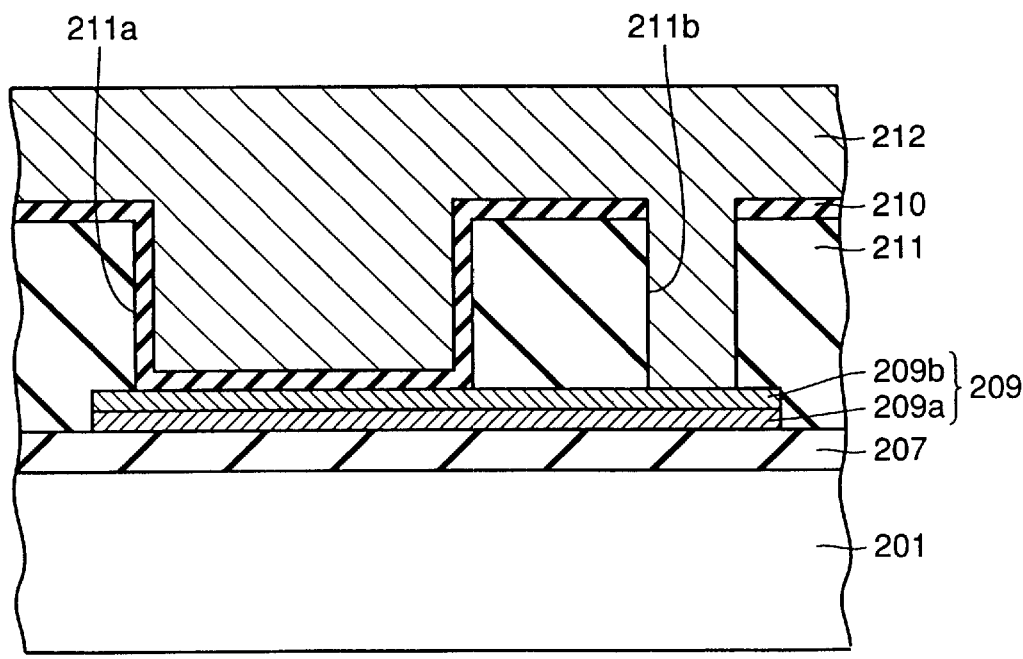
Figure 22:
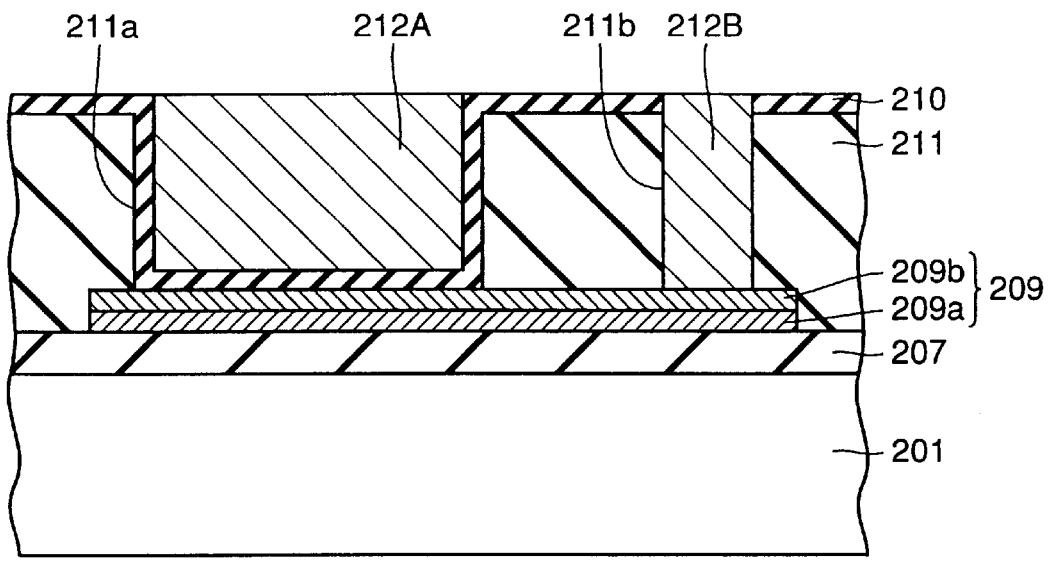
Figure 23:
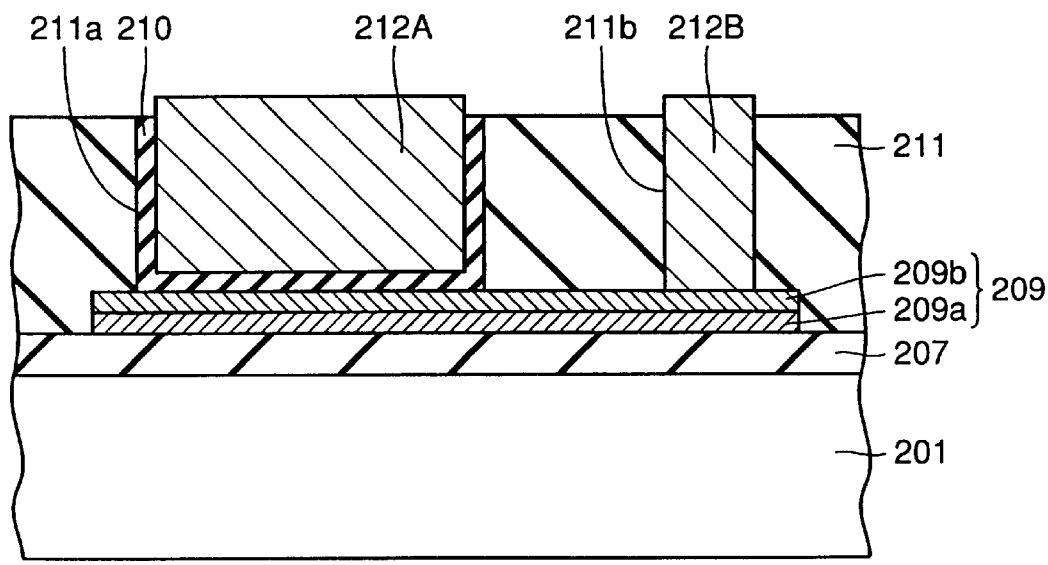

In the present embodiment, dielectric layer for capacitive element 10 is in contact with lower electrode 9A not only at a portion directly below plug hole 11a but also at a portion outside plug hole 11a. Thus, the device of the present embodiment is provided with enhanced effect of preventing diffusion of metal atoms from lower electrode 9A as compared with the conventional structure shown in FIG. 17.

Due to recent miniaturization of metal interconnections, it is becoming difficult to form a fine resist pattern by photolithography. To provide a resist pattern with sufficient dimensional controllability, it is effective to reduce the thickness of photoresist. However, if the thickness of the photoresist is too small, the metal interconnections may be disconnected as the photoresist is removed during etching.

In the present embodiment, dielectric layer for capacitive element 10 is used as an etching mask for forming metal interconnections, so that the metal interconnections can be formed with sufficient dimensional accuracy.

In addition, metal plug portion 12A filled in plug hole 11a of interlayer insulating layer 11 is used as an electrode of capacitive element C, the problem associated with improper formation of the contact hole of the conventional semiconductor device can be avoided as in the first embodiment.

As described above, a capacitive element with stabilized electrical characteristic can be obtained.

Third Embodiment

Figure 8:
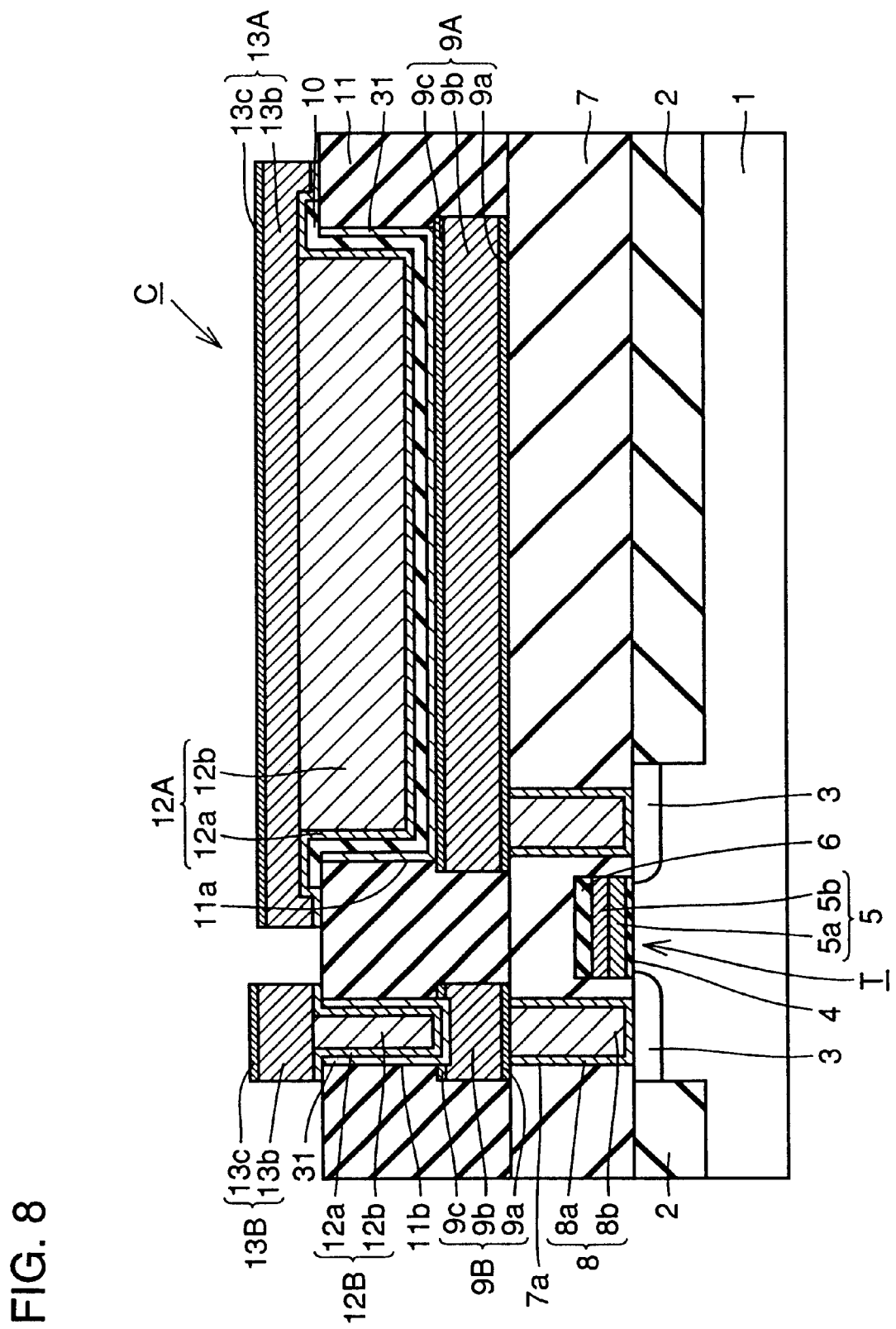
FIG. 8 is a cross sectional view schematically showing the structure of a semiconductor device having a capacitive element according to a third embodiment of the present invention.

Referring to FIG. 8, the structure of the present embodiment differs from that of the first embodiment in the structures of capacitive element C and through hole 11b. The lower electrode of capacitive element C has a first lower electrode portion 9A and a second lower electrode portion 31. First lower electrode portion 9A has the same structure as lower electrode 9A of the first embodiment. Second lower electrode portion 31 has a cylindrical shape extending along the side surface of plug hole 11a and is in contact with the upper surface of first lower electrode portion 9A. Second lower electrode layer 31 is formed only in plug hole 11a, not positioned on the upper surface of interlayer insulating layer 11.

Second lower electrode layer 31 has a high melting point metal such as Ti, TiN, W, WN, TaN, WSi, TiSi, or TiSiN or a compound thereof, Al, an Al alloy such as AlCu, or Cu, Al, or Ag.

A metal plug portion 12A for the upper electrode is formed opposite to first lower electrode portion 31 through dielectric layer for capacitive element 10 to fill in plug hole 11a. Metal plug portion 12A has a first layer 12a and a second layer 12b. First layer 12a has a high melting point metal such as Ti, Ta, W, Mo, or Hf, or a nitride or silicate thereof, or a stack structure of any of these materials. Second layer 12b has W, Ti, TiN, Cu, Al or AlSi, or, AlCu.

Upper layer portion 13A has a metal layer 13b which is in contact with metal plug portion 12A, and a metal layer 13c formed on metal layer 13b. Metal layer 13b includes an Al alloy of Al, AlSi, AlSiCu, or AlCu, or W, Cu, or TiN. Metal layer 13c includes TiN, TaN, WN, WSi, or MoSi for the purpose of decreasing a surface reflectance during photolithography to facilitate resist pattern formation and improving reliability of metal interconnections.

Through hole 11b is filled with metal layer 31 and metal plug 12B. Metal layer 31 has the same material as second lower electrode portion 31. Metal layers 12a and 12b of metal plug 12B has the same material as metal layers 12a and 12b of metal plug portion 12A, respectively.

A second metal interconnection 13B is formed to have contact with metal plug 12B. Metal layers 13b and 13c of second metal interconnection 13B has the same material as metal layers 13b and 13c of upper layer portion 13A, respectively. Note that the other parts of the structure are almost the same as those of the first embodiment, and therefore the same parts are denoted by the same reference characters and the description thereof will not be repeated.

Now, a method of manufacturing the device of the present embodiment will be described.

Figure 9:
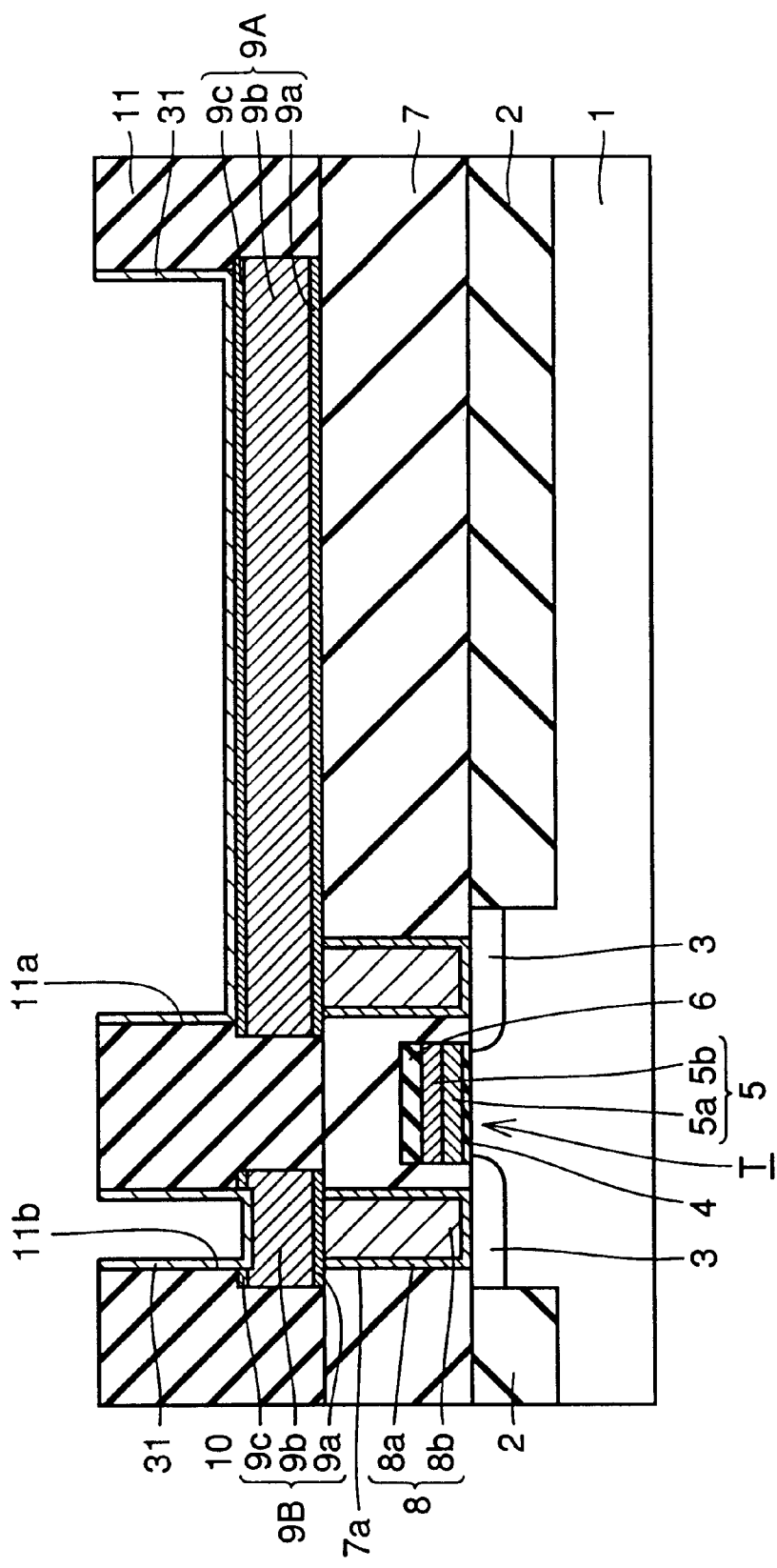
FIGS. 9 and 10 are schematic cross sectional views sequentially showing steps of a method of manufacturing the semiconductor device having the capacitive element according to the third embodiment of the present invention.

The manufacturing method of the present invention is the same as that of the first embodiment up to the steps described with reference to FIGS. 2 and 3. Thereafter, referring to FIG. 9, an interlayer insulating layer 11 is formed to cover a first lower electrode 9A and first metal interconnection 9B. A plug hole 11a and a through hole 11b are formed in interlayer insulating layer 11 by usual photolithography and etching. A metal layer 31 is formed to cover inner surfaces of plug hole 11a and through hole 11b over the entire surface. Thereafter, metal layer 31 on the upper surface of interlayer insulating layer 11 is removed by CMP or metal layer 31 is etched back after selectively forming a resist in plug hole 11a and through hole 11b, so that metal layer 31 is selectively left only in plug hole 11a and through hole 11b.

Figure 10:
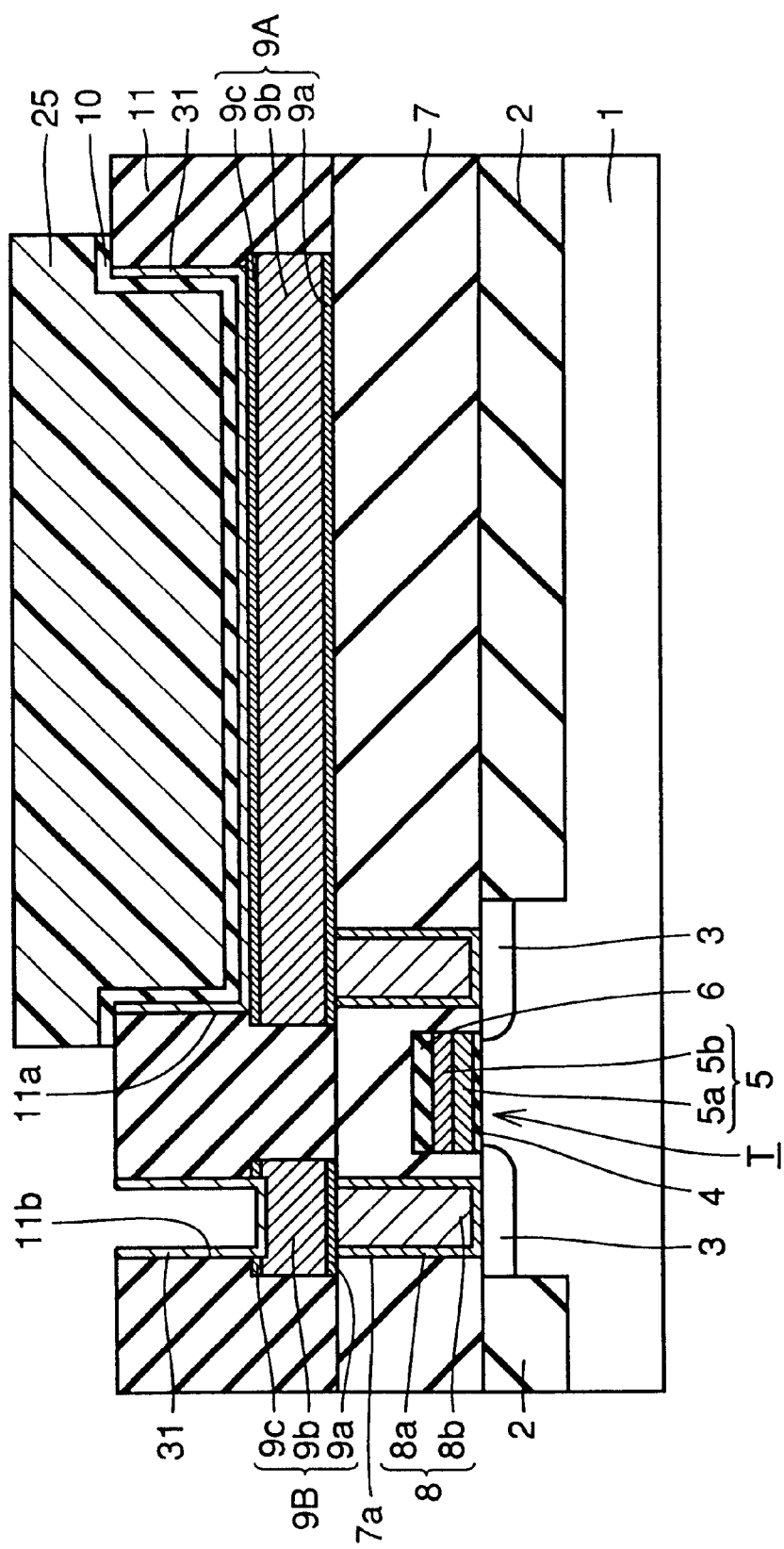

Referring to FIG. 10, dielectric layer for capacitive element 10 is formed to cover the entire surface. A resist pattern 25 is formed on dielectric layer for capacitive element 10, which is then etched using resist pattern 25 as a mask. This leaves dielectric layer for capacitive element 10 on the inner surface and the periphery of plug hole 11a. Resist pattern 25 is removed for example by ashing.

Subsequently, metal plugs 12A and 12B of a first layer 12a and a second layer 12b are formed to fill in plug hole 11a and through hole 11b as shown in FIG. 8. Further, an upper layer portion 13A and a second metal interconnection layer 13B are formed to be electrically connected to metal plugs 12A and 12B, respectively.

This completes a semiconductor device having a capacitive element of the third embodiment.

In the present embodiment, the lower electrode has a cylindrical portion like second lower electrode portion 31, so that a capacitive element with greater capacitance can be formed with a given floor size as compared with the semiconductor devices of the first and second embodiments.

Because the upper electrode is formed to fill in plug hole 11a, improper formation of through hole 11b can be avoided as in the first and second embodiments.

Fourth Embodiment

Figure 11:
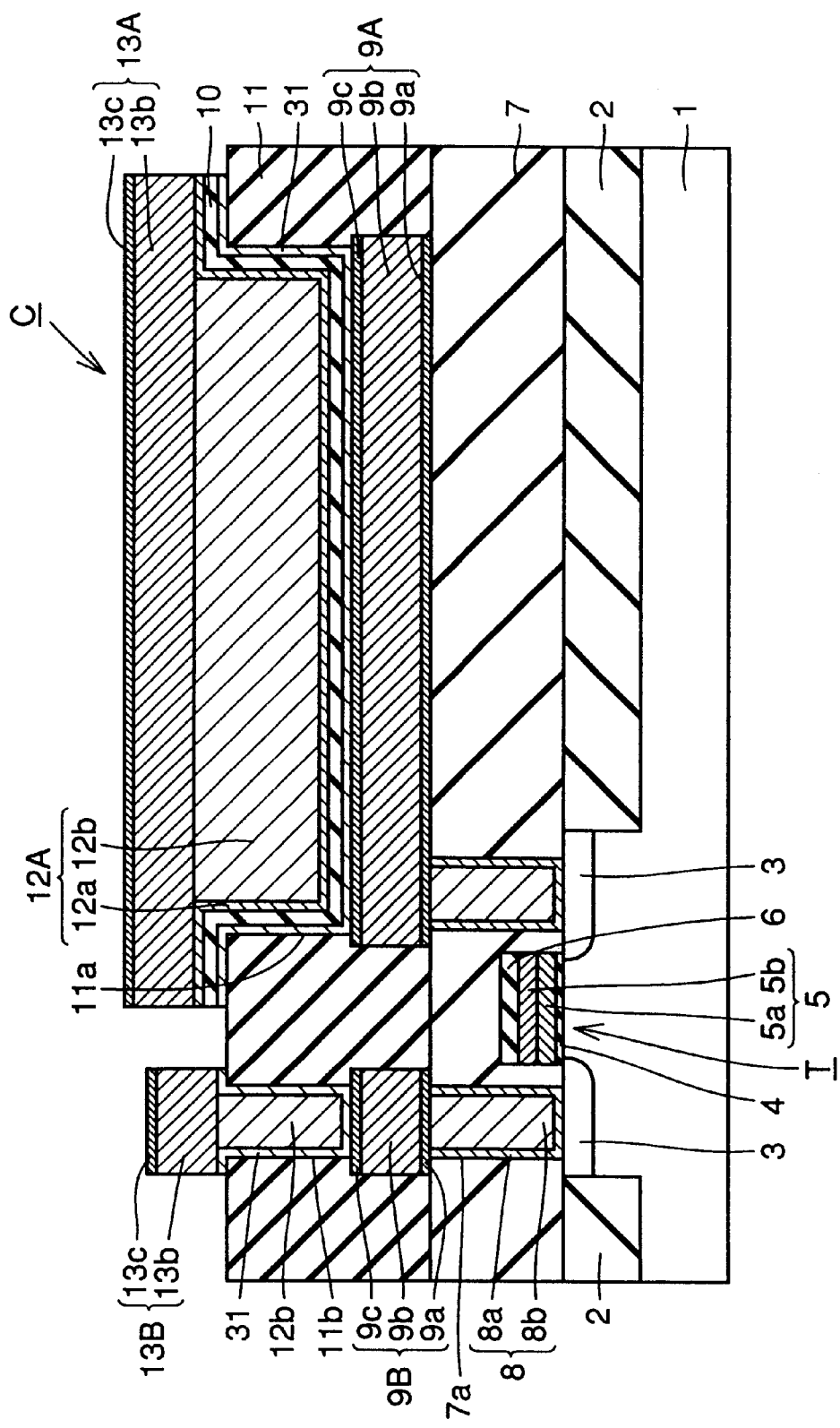
FIG. 11 is a cross sectional view schematically showing a structure of a semiconductor device having a capacitive element according to a fourth embodiment of the present invention.
Figure 12:
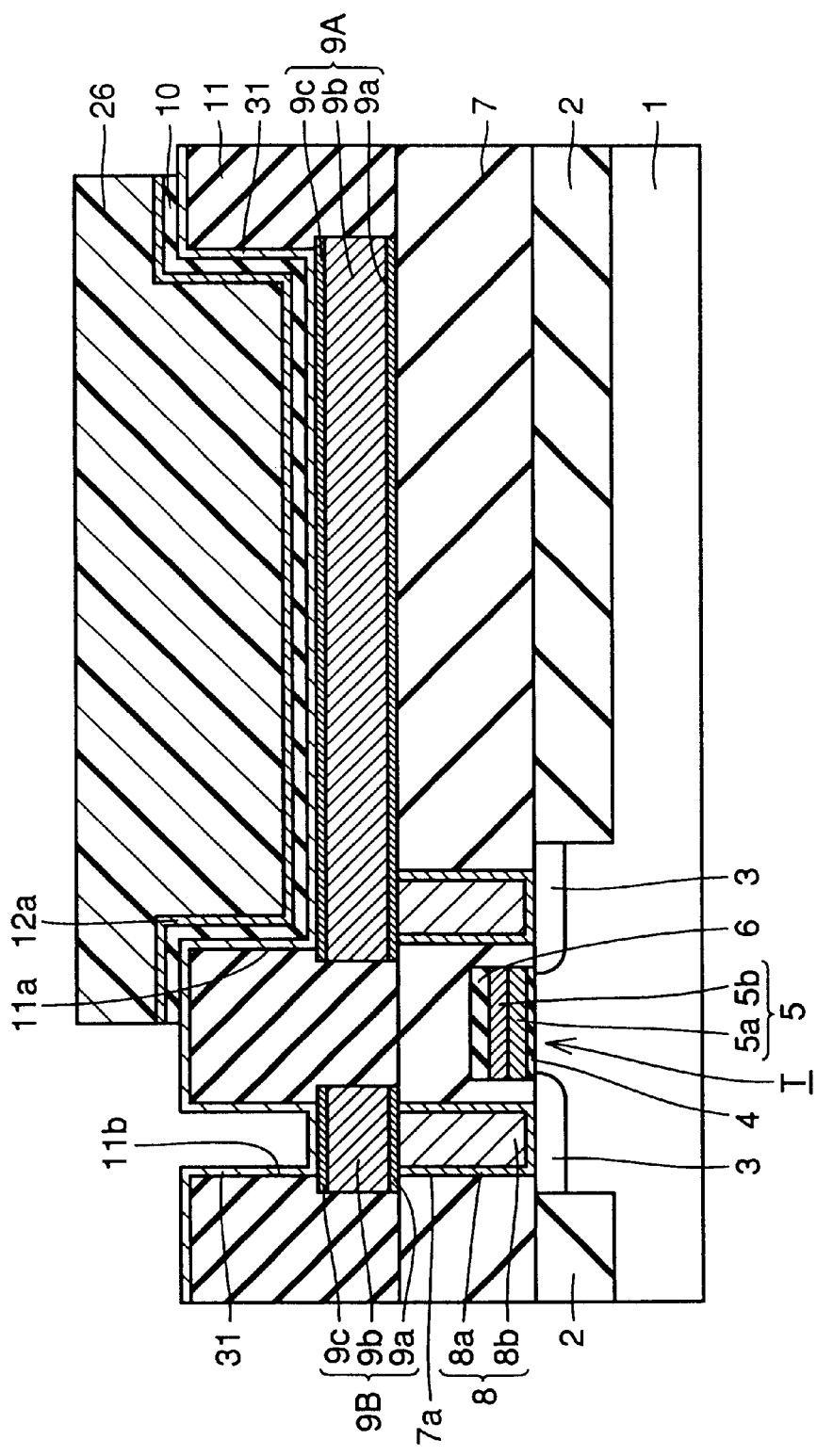
FIGS. 12 and 13 are schematic cross sectional views sequentially showing steps of a method of manufacturing the semiconductor device having the capacitive element according to the fourth embodiment of the present invention.

Referring to FIG. 11, the structure of the present embodiment differs from that of the third embodiment in the structures of second lower electrode portion 31 and through hole 11b. Second lower electrode portion 31 is formed not only in plug hole 11a but also on a part of the upper surface of interlayer insulating layer 11. The side surface of second lower electrode portion 31 is continuous to the side surfaces of dielectric layer for capacitive element 10 and first layer 12a.

Through hole 11b is filled with metal layer 31 and second layer 12b but not with first layer 12a.

Note that the other parts of the structure are almost the same as those of the above described third embodiment, and therefore the same parts are denoted by the same reference characters and description thereof will not be repeated.

Now, a method of manufacturing the device of the present embodiment will be described.

The manufacturing method of the present embodiment is the same as that of the first embodiment up to the steps described with reference to FIGS. 2 and 3. Thereafter, referring to FIG. 13, an interlayer insulating layer 11 is formed to cover first lower electrode portion 9A and first metal interconnection layer 9B. A plug hole 11a reaching first lower electrode portion 9A and a through hole 11b reaching first metal interconnection layer 9B are formed in interlayer insulating layer 11 by usual photolithography and etching. A metal layer 31 is formed to cover the inner surfaces of plug hole 11a and through hole 11b over the entire surface. Dielectric layer for capacitive element 10 and metal layer 12a are layered over the entire surface of metal layer 31.

A resist pattern 26 is formed on metal layer 12a. Using resist pattern 26 as a mask, metal layer 12a and dielectric layer for capacitive element 10 are etched. As a result, metal layer 12a and dielectric layer for capacitive element 10 are only left in and at the periphery of plug hole 11a. Thereafter, resist pattern 26 is removed for example by ashing.

Figure 13:
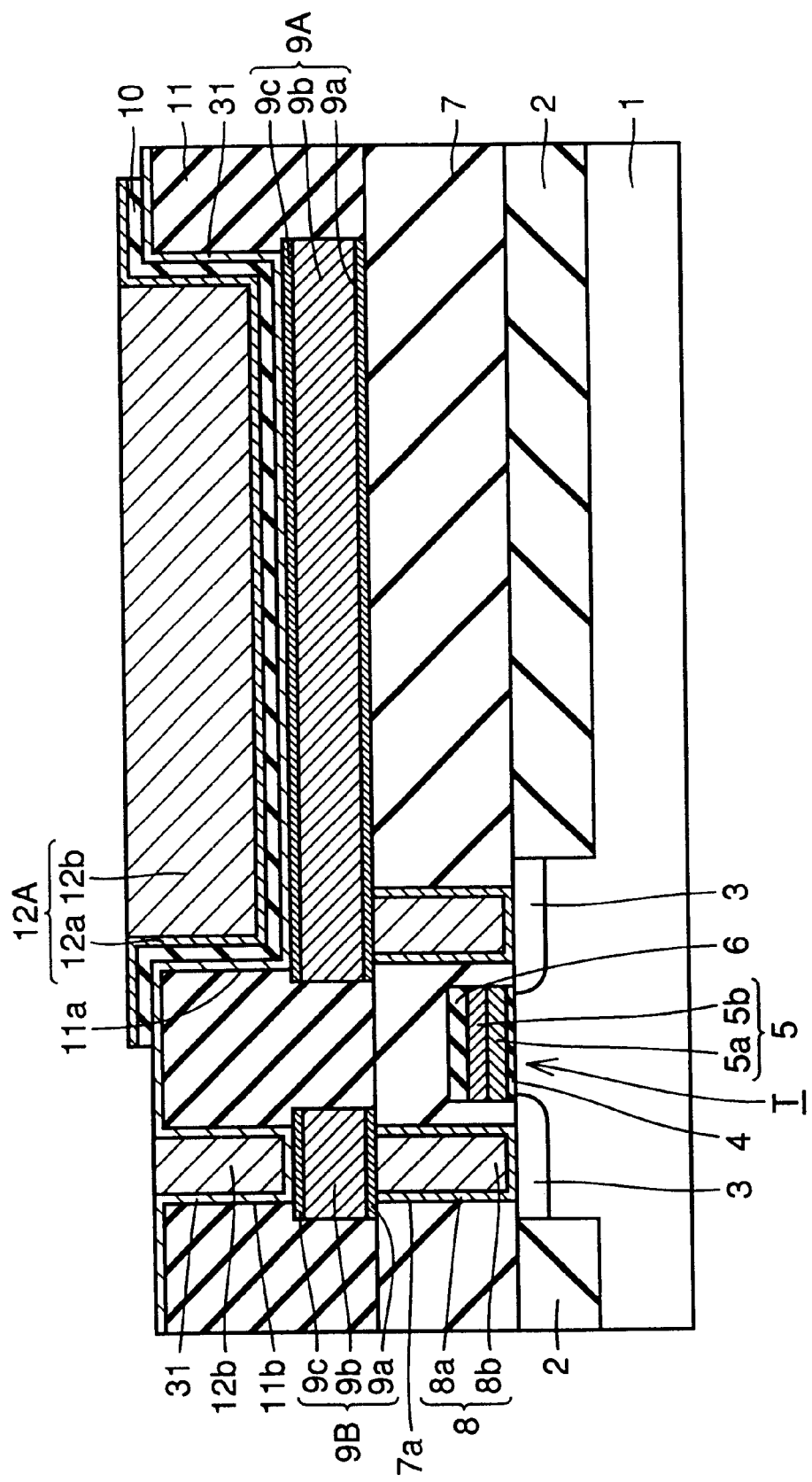

Referring to FIG. 13, a metal layer 12b is formed to fill in plug hole 11a and through hole 11b over the entire surface and then the entire surface is etched back. This leaves metal layer 12b only in plug hole 11a and through hole 11b.

Subsequently, as shown in FIG. 11, metal layers 13b and 13c are formed and patterned by usual photolithography and etching to complete a semiconductor device having a capacitive element of the present invention.

In the present embodiment, second lower electrode portion 31 has a cylindrical portion extending along the inner surface of plug hole 11a. Thus, a capacitive element having greater capacitance can be obtained with a given floor size as compared with the semiconductor device of the first and second embodiments.

In addition, metal plug portion 12A which fills in plug hole 11a avoids the problem associated with improper opening of through hole 11b as in the first to third embodiments.

As in the foregoing, a capacitive element with stabilized electrical characteristic can be obtained.

Fifth Embodiment

Figure 14:
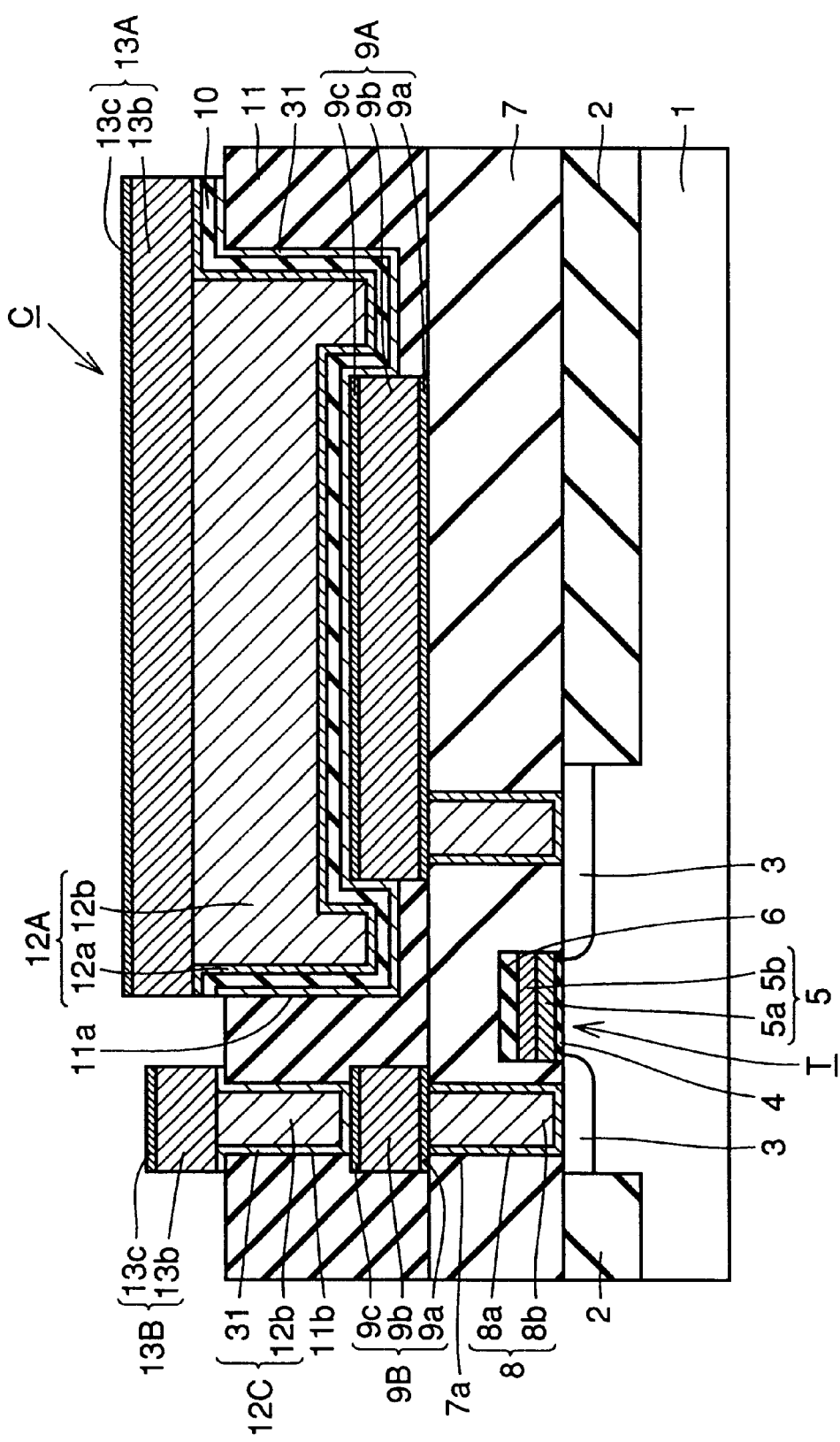
FIG. 14 is a cross sectional view schematically showing a structure of a semiconductor device having a capacitive element according to a fifth embodiment of the present invention.

Referring to FIG. 14, the structure of the present embodiment differs from that of the fourth embodiment in the shape of plug hole 11a. Plug hole 11a has a diameter which is greater than the upper surface of first lower electrode portion 9A when viewed from above. Thus, second lower electrode portion 31 is also in contact with the side wall of first lower electrode portion 9A.

It is noted that the other parts of the structure are almost the same as those of the above described fourth embodiment, and therefore the same parts are denoted by the same reference characters and description thereof will not be repeated.

The manufacturing method of the present embodiment is almost the same as that of the fourth embodiment except that plug hole 11a is formed to have a diameter greater than the upper surface of first lower electrode portion 9A when viewed from above, and therefore description thereof will not be repeated.

In the present embodiment, the opening is formed to have a diameter greater than the upper surface of first lower electrode portion 9A when viewed from above, and therefore a capacitive element with a greater capacitance can be obtained with a given floor size as compared with the semiconductor device of the fourth embodiment.

Sixth Embodiment

Figure 15:
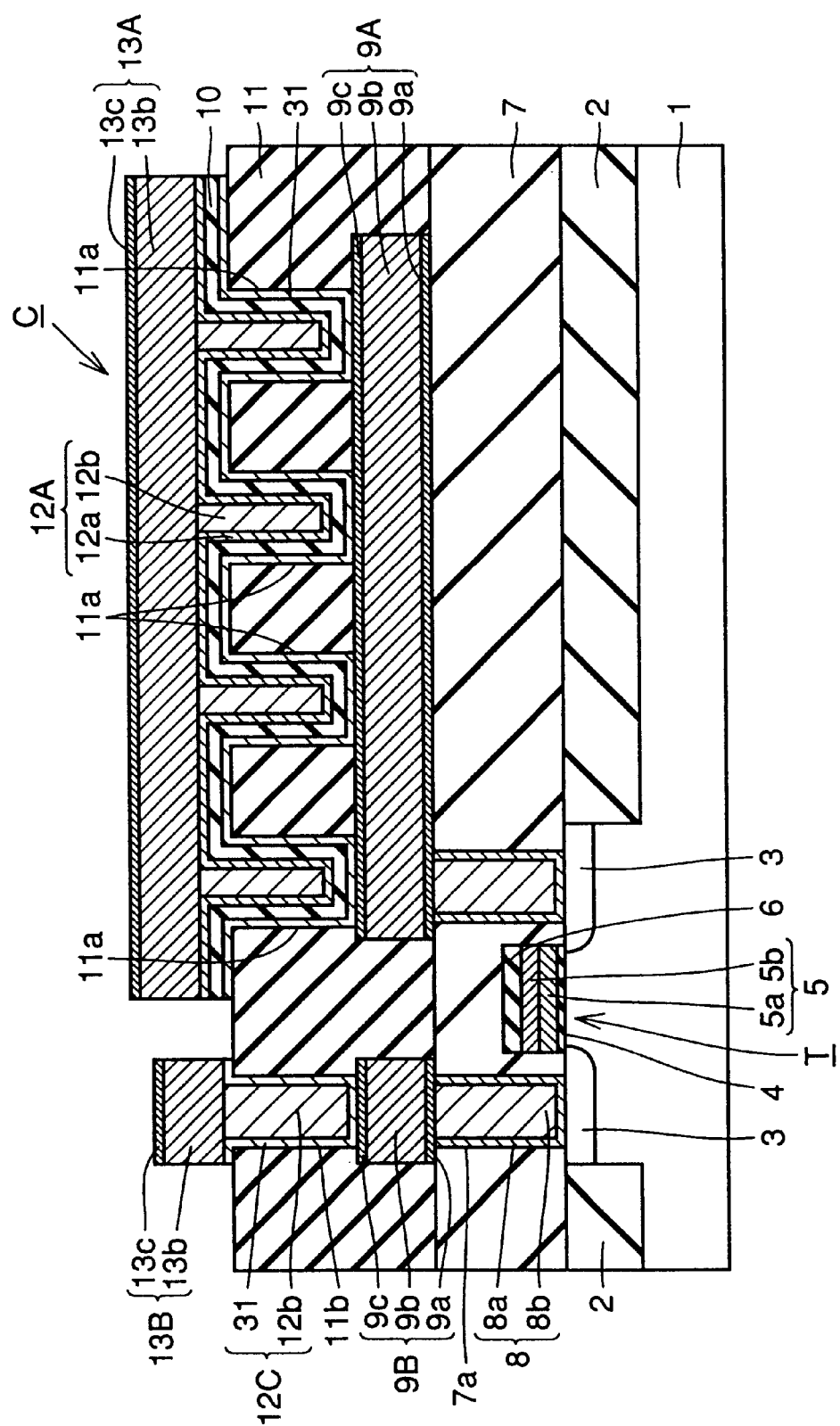
FIG. 15 is a cross sectional view schematically showing a structure of a semiconductor device having a capacitive element according to a sixth embodiment of the present invention.
Figure 16:
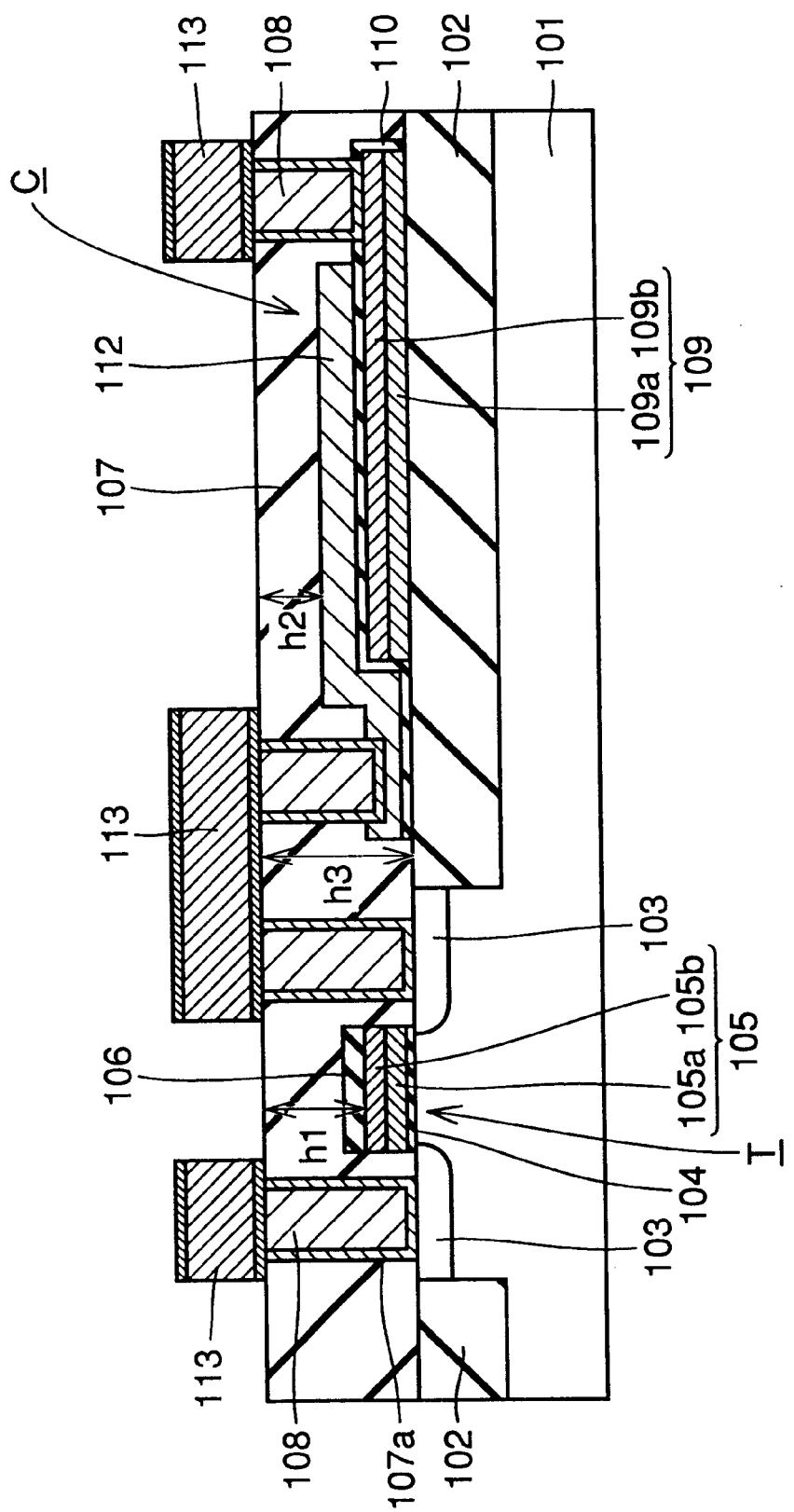
FIG. 16 is a cross sectional view schematically showing a structure of a semiconductor device having a conventional capacitive element.

Referring to FIG. 15, the structure of the present embodiment differs from that of the fourth embodiment in that a plurality of plug holes 11a reaching a single first lower electrode portion 9A are formed. A second lower electrode portion 31 is formed on each of the inner surfaces of the plurality of plug holes 11a. A metal plug portion 12A is formed in each plug hole 11a to be opposite to second lower electrode portion 31 through dielectric layer for capacitive element 10 and to fill in plug hole 11a.

Metal plug portion 12A has a first layer 12a formed in a plurality of plug holes 11a and a second layer 12b which fills in plug hole 11a.

It is noted that the other parts of the structure are almost the same as those of the above described fourth embodiment, and therefore the same parts are denoted by the same reference characters and description thereof will not be repeated.

The manufacturing method of the present embodiment is the same as that of the fourth embodiment except that a plurality of plug holes 11a are formed, and therefore description thereof will not be repeated.

In the present embodiment, the plurality of plug holes 11a provide convex and concave portions in interlayer insulating layer 11. Thus, a capacitive element having a greater capacitance can be obtained with a given floor size as compared with the semiconductor device of the fourth embodiment.

Note that, in each of the first to sixth embodiments, a plug hole (opening) is formed in the interlayer insulating layer between the first and second metal interconnection layers and the upper electrode of the capacitive element is formed in the plug hole as a plug layer. However, in the case of a semiconductor device having two or more metal interconnection layers, a similar effect can be produced by a capacitive element having a similar structure in an interlayer insulating layer between the metal interconnection layers other than the above described first and second metal interconnection layers.

Although the present invention has been described and illustrated in detail, it is clearly understood that the same is by way of illustration and example only and is not to be taken by way of Imitation, the spirit and scope of the present invention being limited only by the terms of the appended claims.

What is claimed is:

1. A method of manufacturing a semiconductor device having a capacitive element, comprising the sequential steps of:

forming a dielectric layer for capacitive element on a lower electrode layer;

forming an insulating layer to cover said lower electrode layer and said dielectric layer for capacitive element;

planarizing said insulating layer by chemical mechanical polishing;

forming a hole reaching said dielectric layer for capacitive element in said insulating layer; and forming an upper electrode layer to fill in said hole.

2. The method of manufacturing the semiconductor device having the capacitive element according to claim 1, wherein said step of forming said dielectric layer for capacitive element on said lower electrode layer includes the step of forming said dielectric layer for capacitive element to cover an upper and side surfaces of said lower electrode layer after patterning said lower electrode layer.

3. The method of manufacturing the semiconductor device having the capacitive element according to claim 1, wherein said step of forming said dielectric layer for capacitive element on said lower electrode layer includes the step of forming said dielectric layer for capacitive element on a conductive layer later to be said lower electrode layer and then patterning said conductive layer and said dielectric layer for capacitive element.

4. The method according to claim 1, comprising forming the upper electrode by:

depositing a metal plug filling the hole to form a lower plug portion of the upper electrode layer; and forming an upper portion of the upper electrode layer on and in direct contact with the lower plug portion.

5. The method according to claim 4, wherein the upper portion of the upper electrode comprises a composite of a metal sandwiched between conductive layers.

* * * * *